(12) United States Patent
Ino et al.

(10) Patent No.: US 8,569,823 B2
(45) Date of Patent: Oct. 29, 2013

(54) SEMICONDUCTOR DEVICE AND MANUFACTURING METHOD THEREOF

(75) Inventors: Tsunehiro Ino, Fujisawa (JP); Masao Shingu, Kawasaki (JP); Shosuke Fujii, Yokohama (JP); Akira Takashima, Fuchu (JP); Daisuke Matsushita, Hiratsuka (JP); Jun Fujiki, Yokohama (JP); Naoki Yasuda, Yokohama (JP); Yasushi Nakasaki, Yokohama (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 13/235,970

(22) Filed: Sep. 19, 2011

(65) Prior Publication Data

US 2012/0068250 A1  Mar. 22, 2012

Related U.S. Application Data

(63) Continuation of application No. PCT/JP2010/053572, filed on Mar. 4, 2010.

(30) Foreign Application Priority Data

Mar. 19, 2009  (JP) ................................ 2009-069081

(51) Int. Cl.
*H01L 29/788*  (2006.01)

(52) U.S. Cl.
USPC .......................................... 257/321; 438/263

(58) Field of Classification Search
USPC .......................................... 257/321; 438/263
See application file for complete search history.

(56) References Cited

U.S. PATENT DOCUMENTS

| 6,969,886 B1 * | 11/2005 | Park et al. ...................... 257/324 |
| 7,763,934 B2 | 7/2010 | Shimizu et al. |
| 7,842,996 B2 | 11/2010 | Kikuchi et al. |
| 7,943,981 B2 | 5/2011 | Ino et al. |
| 7,956,405 B2 | 6/2011 | Ino et al. |
| 2007/0138539 A1 * | 6/2007 | Wu et al. ........................ 257/324 |
| 2008/0121963 A1 * | 5/2008 | Govindarajan ............... 257/310 |
| 2008/0217680 A1 | 9/2008 | Shimizu et al. |
| 2008/0303119 A1 | 12/2008 | Watanabe |
| 2011/0241101 A1 | 10/2011 | Ino et al. |

FOREIGN PATENT DOCUMENTS

| JP | 2004-071877 | 3/2004 |
| JP | 2005-259954 | 9/2005 |
| JP | 2008-091421 | 4/2008 |
| JP | 2008-244243 | 10/2008 |
| JP | 2008-306036 | 12/2008 |
| JP | 2009-004639 | 1/2009 |

OTHER PUBLICATIONS

International Search Report issued Apr. 6, 2010 in PCT/JP2010/053572 filed Mar. 4, 2010.

(Continued)

*Primary Examiner* — Douglas Menz
(74) *Attorney, Agent, or Firm* — Oblon, Spivak, McClelland, Maier & Neustadt, L.L.P.

(57) ABSTRACT

According to one embodiment, a semiconductor device includes a semiconductor region, a tunnel insulating film provided on the semiconductor region, a charge storage insulating film provided on the tunnel insulating film and having a hafnium oxide including a cubic region, a block insulating film provided on the charge storage insulating film, and a control gate electrode provided on the block insulating film.

17 Claims, 13 Drawing Sheets

(56) References Cited

OTHER PUBLICATIONS

S. Migita et al.; "Thermal Stability and Size Scalability of Metastable Cubic Phase $HfO_2$ with k=50"; IWDTF, 2008, pp. 7-8.

S. Migita et al.; "Design and Demonstration of Very High-k (k-50) $HfO_2$ for Ultra-Scaled Si CMOS"; Symposium on VLSI Technology Digest of Technical Papers, 2008, pp. 152-153.

* cited by examiner

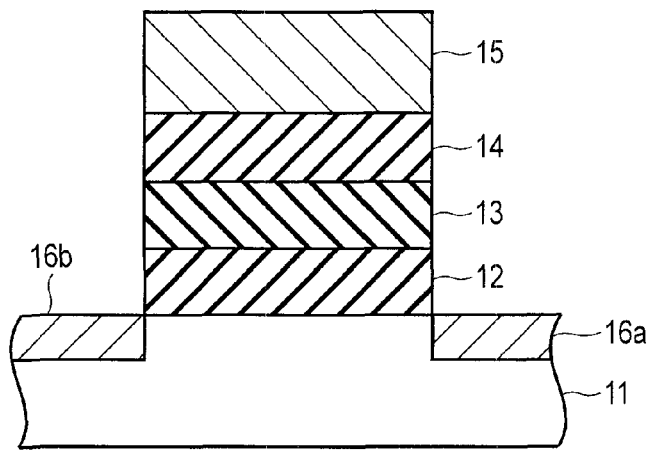
F I G. 1
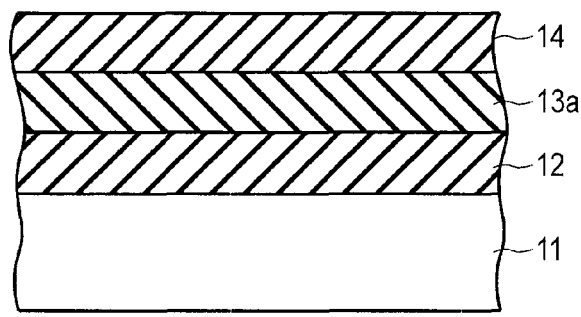
F I G. 2
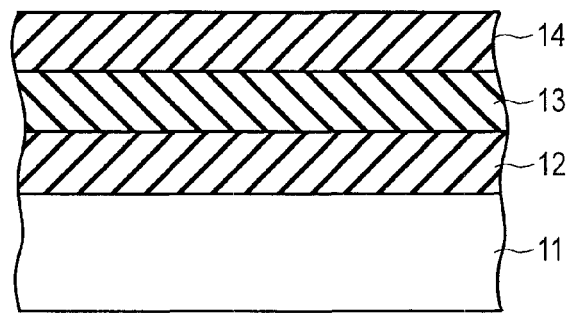
F I G. 3

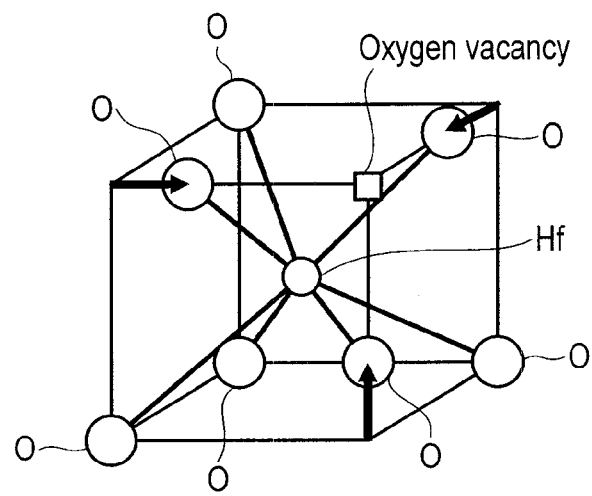
F I G. 4
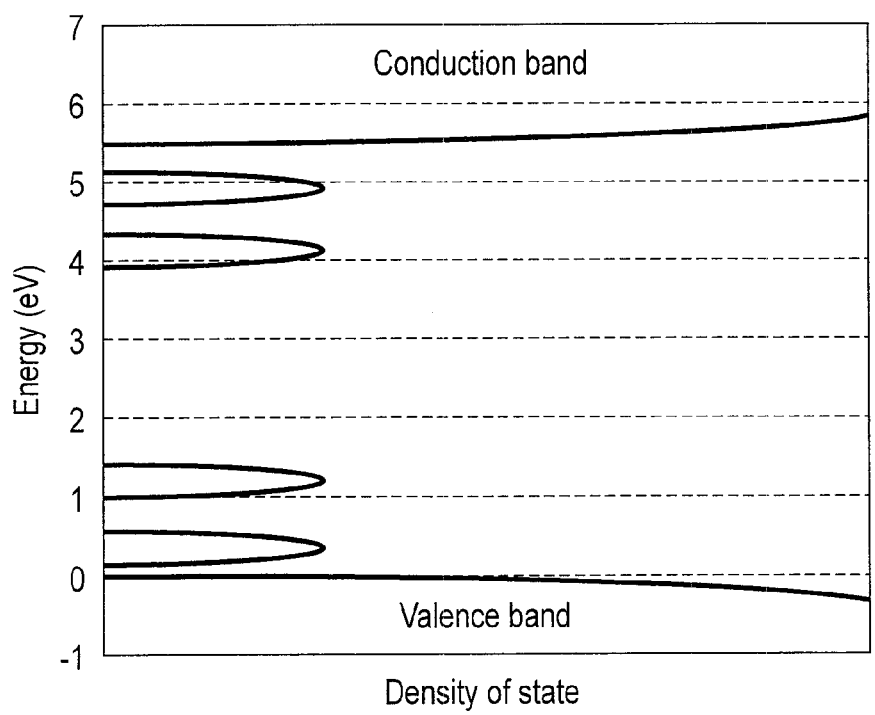
F I G. 5

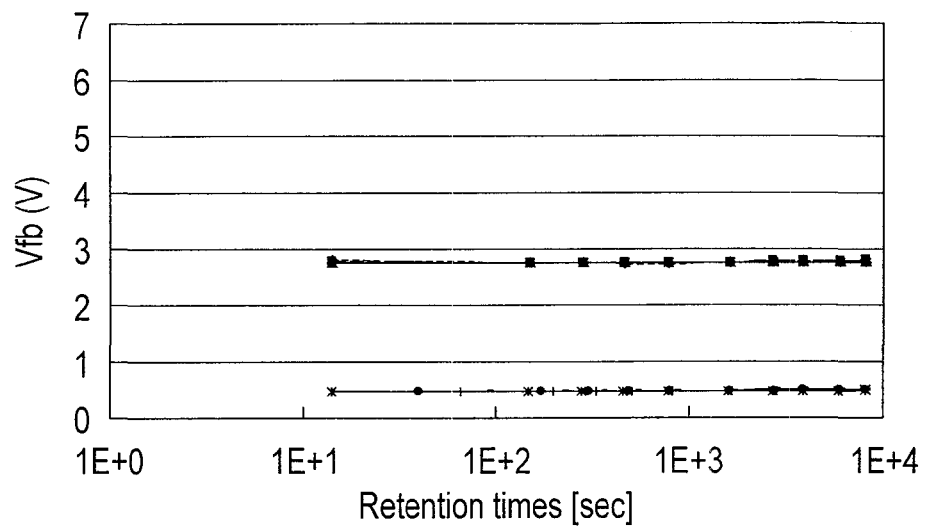
F I G. 10
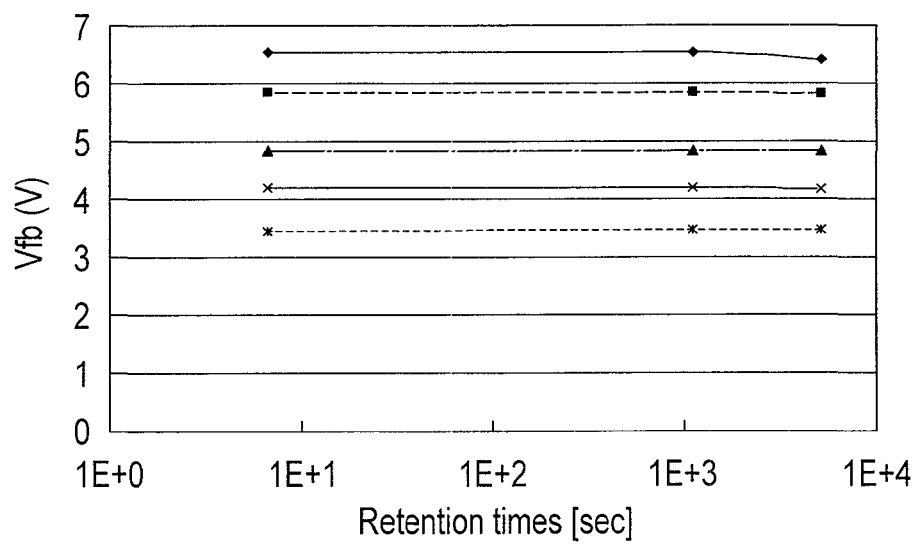
F I G. 11

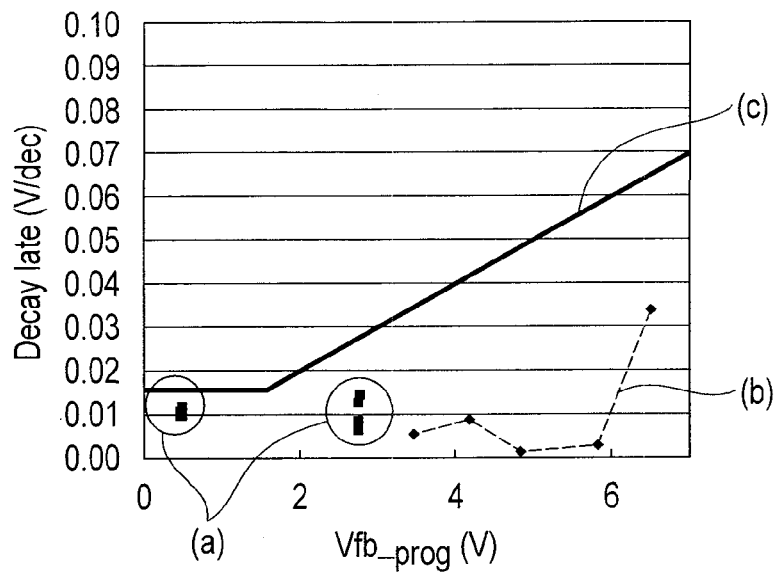
F I G. 12
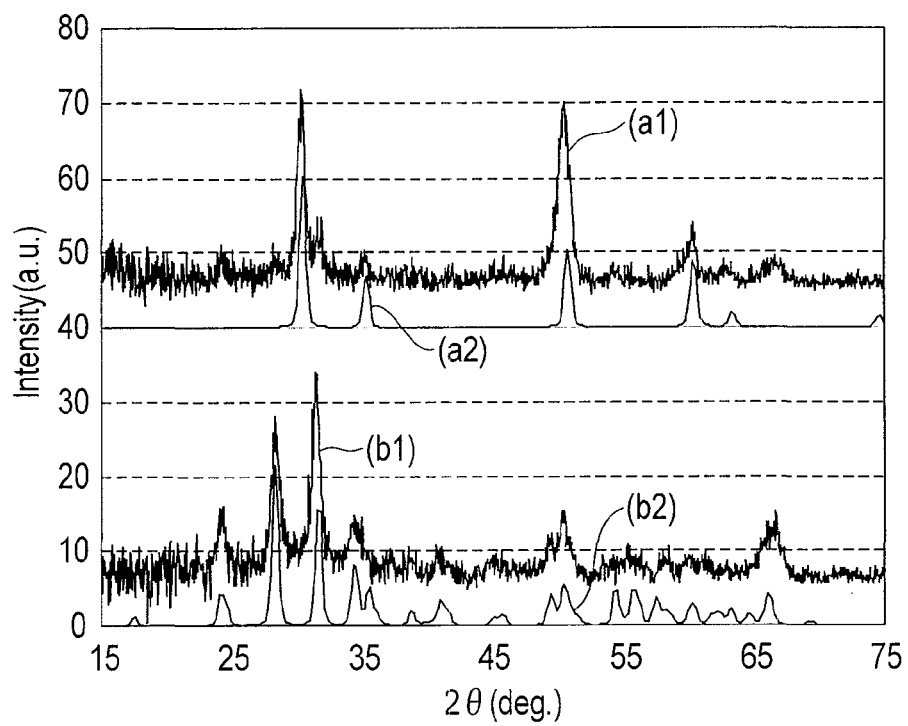
F I G. 13

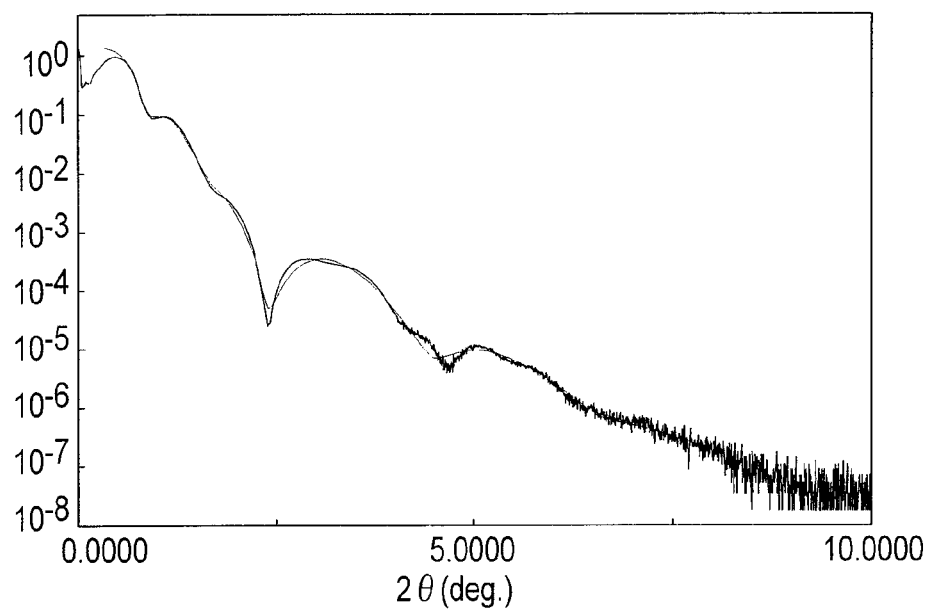
F I G. 14
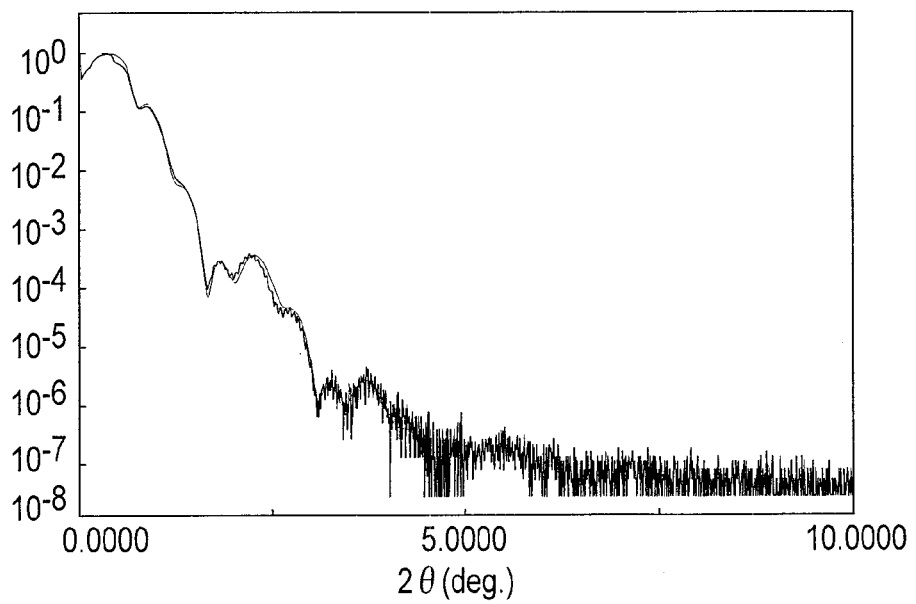
F I G. 15

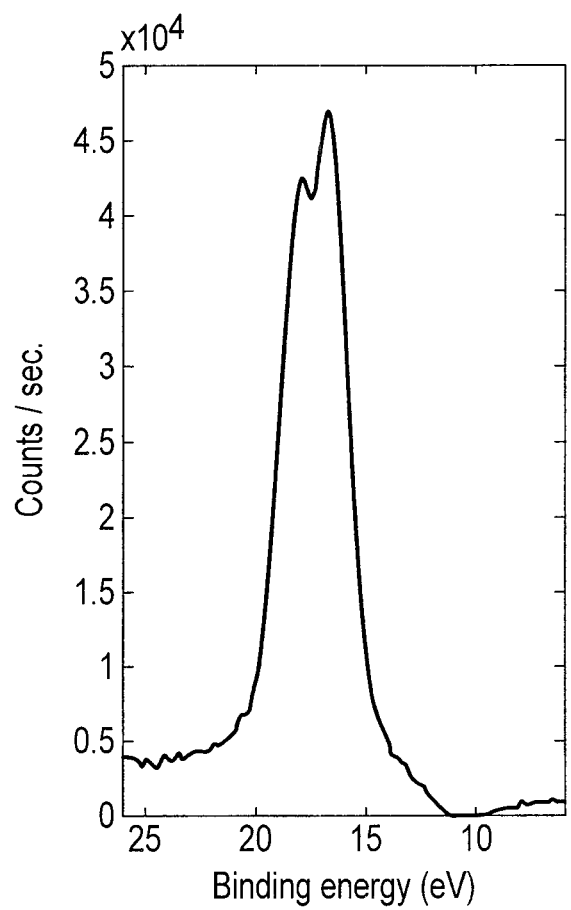
F I G. 16

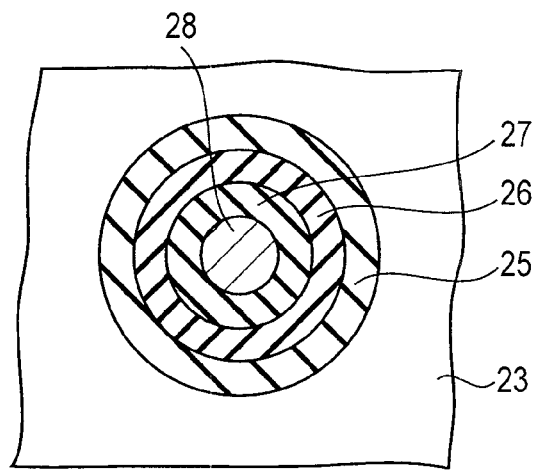
F I G. 18
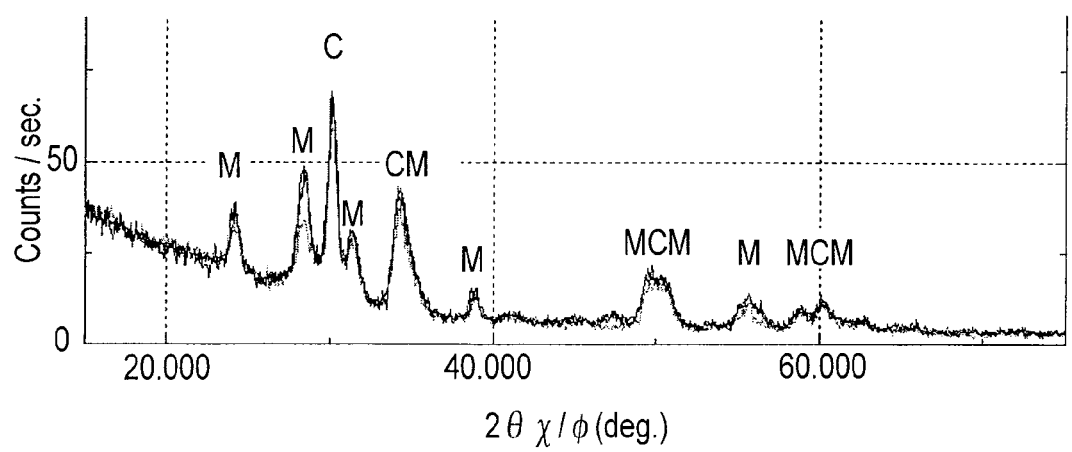
F I G. 19

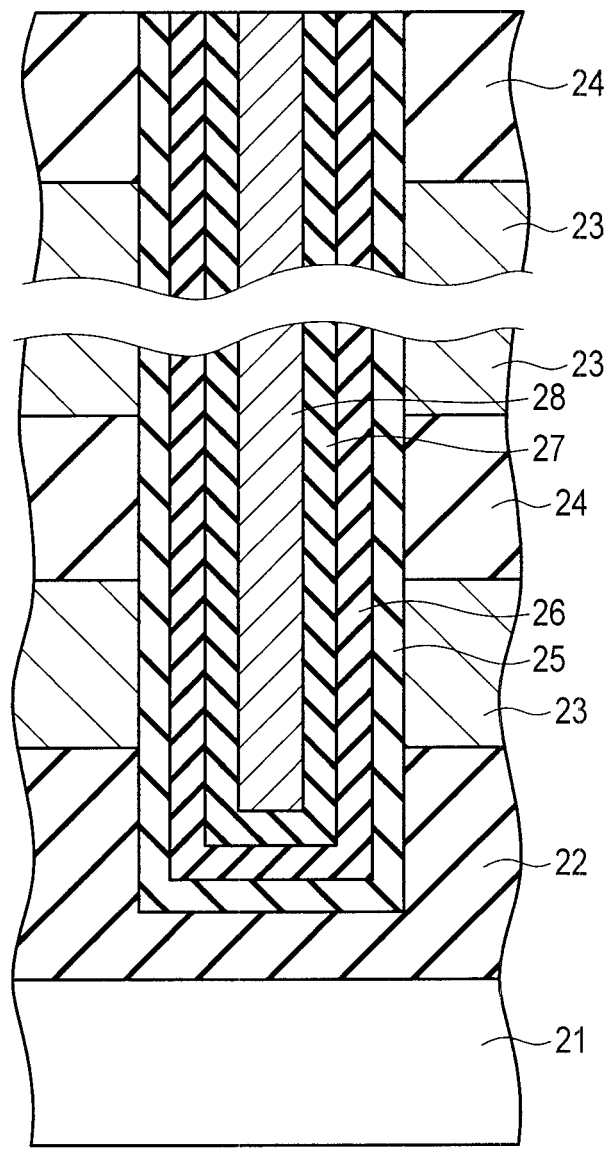
F I G. 20

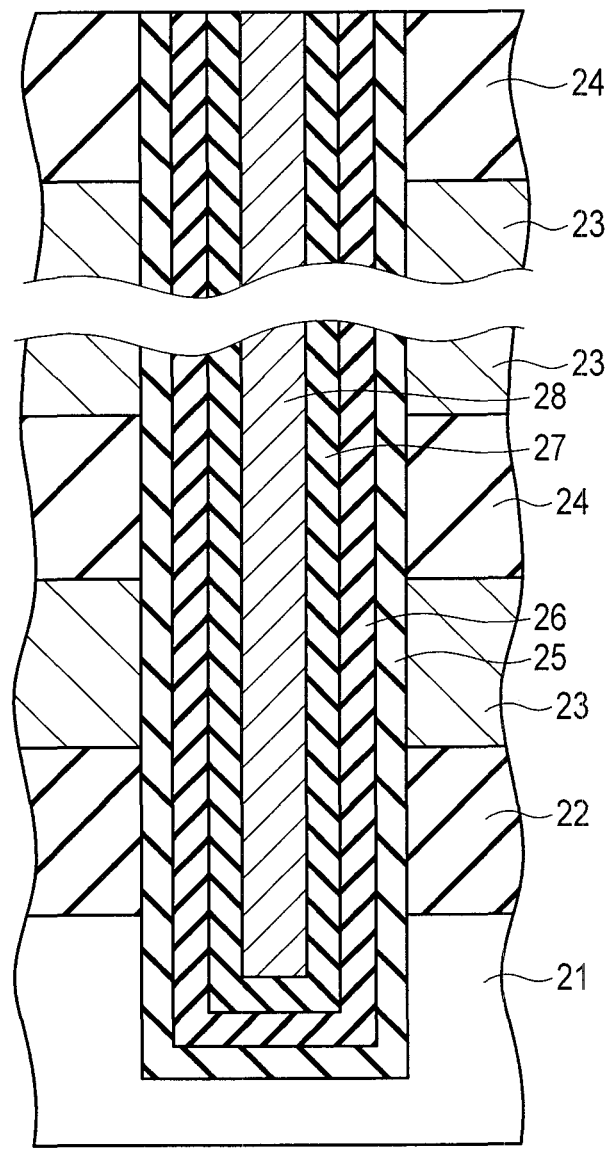
F I G. 21

SEMICONDUCTOR DEVICE AND MANUFACTURING METHOD THEREOF

CROSS REFERENCE TO RELATED APPLICATIONS

This application is a Continuation Application of PCT Application No. PCT/JP2010/053572, filed Mar. 4, 2010 and based upon and claiming the benefit of priority from prior Japanese Patent Application No. 2009-069081, filed Mar. 19, 2009, the entire contents of all of which are incorporated herein by reference.

FIELD

Embodiments described herein relate generally to a semiconductor device and a manufacturing method thereof.

BACKGROUND

Charge trapping nonvolatile semiconductor memories using a charge storage insulating film for charge trapping as a charge storage layer have been proposed (see Jpn. Pat. Appln. KOKAI Publication No. 2004-71877). In this type of charge trapping nonvolatile semiconductor memory, electric charges injected through a tunnel insulating film into the charge storage insulating film are trapped at a trap level in the charge storage insulating film, and thereby stored in the charge storage insulating film. As a typical charge trapping nonvolatile semiconductor memory, a MONOS-type nonvolatile semiconductor memory is known, and a silicon nitride film is typically used as the charge storage insulating film.

However, it is not necessarily appropriate to suggest that excellent charge storage insulating films can be achieved conventionally, and it is not appropriate to suggest that non-volatile semiconductor memories excellent in both writing/erasing characteristics and charge retention characteristics are obtained conventionally.

BRIEF DESCRIPTION OF THE DRAWINGS

FIG. 1 is a cross-sectional view schematically illustrating the fundamental structure of a semiconductor device according to a first embodiment;

FIG. 2 is a cross-sectional view schematically illustrating partially a process for manufacturing a semiconductor device according to the first embodiment;

FIG. 3 is a cross-sectional view schematically illustrating partially the process for manufacturing a semiconductor device according to the first embodiment;

FIG. 4 is a diagram schematically illustrating the crystal structure of a hafnium oxide according to the first embodiment;

FIG. 5 is a diagram schematically illustrating the energy band structure of a hafnium oxide film according to the first embodiment;

FIG. 10 is a diagram showing charge retention characteristics of the semiconductor device according to the first embodiment;

FIG. 11 is a diagram showing charge retention characteristics of the semiconductor device according to the comparative example in contrast to the first embodiment;

FIG. 12 is a diagram showing the rate of change of flat band voltage Vfb for the first embodiment and the comparative example;

FIG. 13 is a diagram showing the results of X-ray diffraction for hafnium oxide films according to the first embodiment and the comparative example;

FIG. 14 is a diagram showing a measurement result obtained by a GIXA for the hafnium oxide film according to the first embodiment;

FIG. 15 is a diagram showing a measurement result obtained by a GIXA for the hafnium oxide film according to the comparative example in contrast to the first embodiment;

FIG. 16 is a diagram showing an XPS measurement result for the hafnium oxide film according to the first embodiment;

FIG. 18 is a cross-sectional view schematically illustrating the fundamental structure of the semiconductor device according to the second to fifth embodiments;

FIG. 19 is a diagram showing an X-ray diffraction profile for a charge storage insulating film;

FIG. 20 is a cross-sectional view schematically illustrating the fundamental structure of a semiconductor device according to a modification example of the second to fifth embodiments;

FIG. 21 is a cross-sectional view schematically illustrating the fundamental structure of a semiconductor device according to a modification example of the second to fifth embodiments.

DETAILED DESCRIPTION

Figure 6:
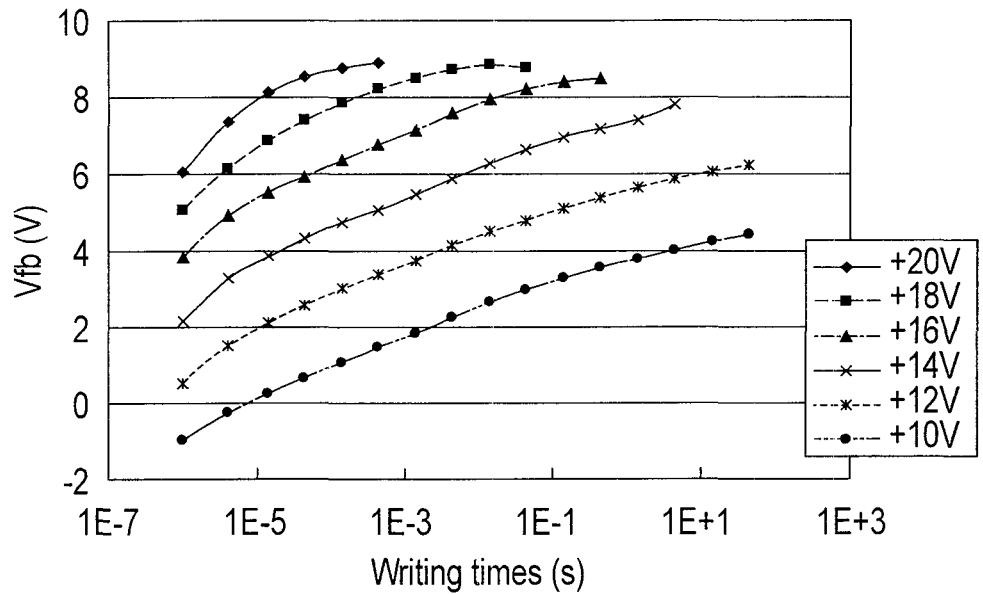
FIG. 6 is a diagram showing writing characteristics of the semiconductor device according to the first embodiment.

In general, according to one embodiment, semiconductor device includes a semiconductor region; a tunnel insulating film provided on the semiconductor region; a charge storage insulating film provided on the tunnel insulating film and having a hafnium oxide including a cubic region; a block insulating film provided on the charge storage insulating film; and a control gate electrode provided on the block insulating film.

Embodiments will be described below with reference to the attached drawings.

Embodiment 1

FIG. 1 is a cross-sectional view schematically illustrating the fundamental structure of a semiconductor device (a charge trapping nonvolatile semiconductor storage device) according to a first embodiment.

As shown in FIG. 1, a tunnel insulating film 12 is formed on the surface of a silicon substrate (a semiconductor substrate, a semiconductor region) 11. While a silicon oxide film ($SiO_2$ film) is used for this tunnel insulating film 12, a silicon oxynitride film (SiON film) may be used.

A charge storage insulating film 13 is formed on the surface of the tunnel insulating film 12. This charge storage insulating film is formed of a hafnium oxide film ($HfO_2$ film) including a cubic region, and the hafnium oxide film has an oxygen vacancy. The hafnium oxide film 13 may entirely have a cubic region, or the hafnium oxide film 13 may partially include an amorphous region. In addition, the hafnium oxide film may contain zirconium (Zr).

A block insulating film 14 is formed on the surface of the charge storage insulating film 13. This block insulating film 14 is an insulating film which has the function of blocking a flow of electrons or holes between a charge storage layer and a control gate, and formed of an oxide film such as an aluminum oxide film ($Al_2O_3$ film) or a silicon oxide film ($SiO_2$ film).

A control gate electrode 15 is formed on the surface of the block insulating film 14. A gold film (Au film), a tantalum film (Ta film) or a tantalum compound film, etc. is used for this control gate electrode 15.

The silicon substrate 11 has a source region 16a and a drain region 16b formed in the surface region thereof, and the region between the source region 16a and the drain region 16b serves as a channel region of a transistor.

Next, a method for manufacturing the semiconductor device according to the present embodiment will be described with reference to FIGS. 1 to 3.

First, as shown in FIG. 2, a native oxide film formed at the (100) plane of the silicon substrate (semiconductor substrate) 11 is removed with a diluted hydrofluoric acid solution. Subsequently, as the tunnel insulating film 12, for example, a silicon oxide film ($SiO_2$ film) of 5 nm is formed on the silicon substrate 11 by a thermal oxidation treatment.

Next, a preliminary hafnium oxide film ($HfO_2$ film) 13a with a thickness on the order of 5 nm to serve as the charge storage insulating film is formed on the tunnel insulating film 12 by a reactive sputtering method. Specifically, the hafnium oxide film 13a is formed by sputtering a Hf target in an oxygen gas atmosphere diluted with an Ar gas. At this stage, the hafnium oxide film 13a is an amorphous film. This hafnium oxide film 13a has an oxygen vacancy ratio on the order of, for example, 3 to 5 percent. It is to be noted that it is possible to use not only the reactive sputtering method, but also a sputtering method from a $HfO_2$ target, a CVD (chemical vapor deposition) method, an ALD (atomic layer deposition) method, an EB (electron beam) evaporation method, etc. for the formation of the hafnium oxide film 13a.

Next, as the block insulating film 14, an aluminum oxide film ($Al_2O_3$ film) with a thickness on the order of 10 nm is formed on the hafnium oxide film 13a by a MBE (molecular beam epitaxy) method. It is to be noted that it is possible to use not only the MBE method but also the CVD method, etc. for the formation of the block insulating film 14.

Next, as shown in FIG. 3, a heat (thermal) treatment is carried out at 1050° C. for 30 seconds in a nitrogen gas atmosphere. This heat treatment moves the oxygen contained in the hafnium oxide film 13a to the block insulating film 14 to increase the oxygen vacancy of the hafnium oxide film 13a. As a result, the amorphous hafnium oxide film 13a is converted to the hafnium oxide film 13 including a cubic region. In this case, the hafnium oxide film 13 may entirely have a converted cubic region, or the hafnium oxide film 13 may partially have an amorphous region left.

Next, as shown in FIG. 1, as the control gate electrode film 15, a conductive film such as a gold (Au) film is formed on the block insulating film 14 by a resistance heating evaporation method. Then, the tunnel insulating film 12, the charge storage insulating film 13, the block insulating film 14, and the control gate electrode film 15 are subjected to patterning to form a gate structure. Furthermore, with the use of the gate structure as a mask, the surface region of the silicon substrate is ion implanted with an impurity element to form the source region 16a and the drain region 16b. In this way, a memory cell transistor is formed as shown in FIG. 1.

An additional explanation will be given below of the reason that the heat treatment step shown in FIG. 3 forms the hafnium oxide film 13 including a cubic region.

The stable crystal structure of the hafnium oxide ($HfO_2$) is monoclinic at room temperature and ordinary pressure, and the hafnium oxide that has a cubic crystal structure is not stably present intrinsically. This can be explained mainly by using a model simplified geometrically in such crystallography that uses only factors such as an ionic radius and an atom location. More specifically, the ionic radius of $O^{2-}$ is too large to make eight ions $O^{2-}$ present around $Hf^{4+}$ in a nearest neighbor state. Therefore, the state in which seven ions $O^{2-}$ are present around $Hf^{4+}$ is stable. This state is monoclinic, and the stable crystal structure of the hafnium oxide is typically monoclinic. However, when the hafnium oxide has an oxygen vacancy caused, the hafnium oxide which has a cubic crystal structure can be present stably. More specifically, as shown in FIG. 4, when an oxygen vacancy is caused, $O^{2-}$ is not always present at all of the eight $O^{2-}$ sites in the cubic crystal structure. Therefore, the geometric constraint described above is relaxed so that the hafnium oxide which has a cubic crystal structure can be present stably.

FIG. 5 is a diagram schematically illustrating the energy band structure of the charge storage insulating film (hafnium oxide film) 13 according to the present embodiment.

As shown in FIG. 5, the hafnium oxide film according to the present embodiment has a cubic crystal structure including an oxygen vacancy, and thus has a trap level (localized level) as shown in FIG. 5. More specifically, the trap level is present at an appropriate depth between the valence band and the conduction band. An excessively deep trap level makes it difficult to obtain high-speed writing/erasing characteristics, whereas an excessively shallow trap level makes it difficult to obtain favorable charge retention characteristics. The hafnium oxide film according to the present embodiment has a trap level present at an appropriate depth, thus allowing high-speed writing/erasing characteristics to be obtained, and allowing excellent charge retention characteristics to be achieved. Therefore, the hafnium oxide film according to the present embodiment allows the achievement of a high-performance nonvolatile semiconductor memory which is excellent in characteristics and reliability.

Figure 7:
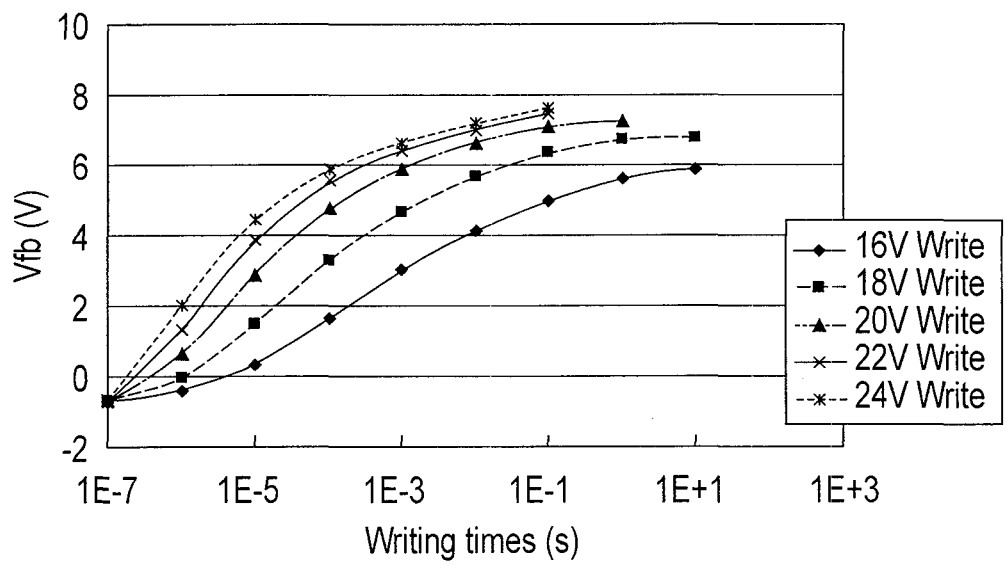
FIG. 7 is a diagram showing writing characteristics of the semiconductor device according to a comparative example in contrast to the first embodiment.

Next, the writing characteristics of the semiconductor device according to the present embodiment will be described with reference to FIGS. 6 and 7. FIG. 6 is a diagram showing the results of measuring CV characteristics of a sample manufactured by the method according to the present embodiment. FIG. 7 is a diagram showing the results of measuring CV characteristics of a sample according to a comparative example. The horizontal axis indicates writing time, whereas the vertical axis indicates a flat band voltage (Vfb).

The sample according to the present embodiment uses a hafnium oxide film (thickness of 5 nm) for the charge storage insulating film, whereas the sample according to the comparative example uses a silicon nitride film (thickness of 5 nm) for the charge storage insulating film. For the block insulating film, each of the samples uses an aluminum oxide film (thickness of 10 nm).

The measurements of the CV characteristics were made in the following way. First, an erasing voltage of −20 V is applied to the both samples for a period of 1 msec. Then, writing voltages from 10 V to 20 V by 2 V are applied to the sample according to the present embodiment. In this regard, the writing time is varied from 1 μsec to 30 sec. The writing voltage is applied from 16 V to 24 V by 2 V to the sample according to the comparative example. The writing time is varied from 0.1 μsec to 10 sec. Then, the characteristics (CV characteristics) of the electric capacitance are measured at each writing voltage and for each writing time.

In the case of the sample according to the present embodiment, the hafnium oxide film has an effective oxide thickness (EOT) of 1.2 nm. In the case of the sample according to the comparative example, the silicon nitride film has an EOT of 2.5 nm. It is to be noted that the ranges of the writing voltage and of the writing time are varied between the sample according to the present embodiment and the sample according to the comparative example, because the ranges are selected so as to make the characteristics of the respective samples easiest to understand.

The followings are determined from the measurement results for the sample according to the present embodiment (FIG. 6) and the measurement results for the sample according to the comparative example (FIG. 7). When a comparison is made at the same writing voltage and the same Vfb, the writing time is shorter in the case of the sample according to the present embodiment than in the case of the sample according to the comparative example. Therefore, the sample according to the present embodiment allows higher speed writing to be carried out. In addition, when a comparison is made in value at which the Vfb shift is saturated, the saturation value is larger in the case of the sample according to the present embodiment than in the case of the sample according to the comparative example. Therefore, the sample according to the present embodiment allows more effective charges to be stored.

It is to be noted that the charge storage insulating film (hafnium oxide film: EOT=1.2 nm) of the sample according to the present embodiment is smaller in EOT than the charge storage insulating film (silicon nitride film: EOT=2.5 nm) of the sample according to the comparative example. If the charge storage insulating films are formed of the same material, the smaller EOT will result in a higher writing speed, but in a smaller saturation stored charge. The use of the charge storage insulating film according to the present embodiment allows this problem to be solved.

Figure 8:
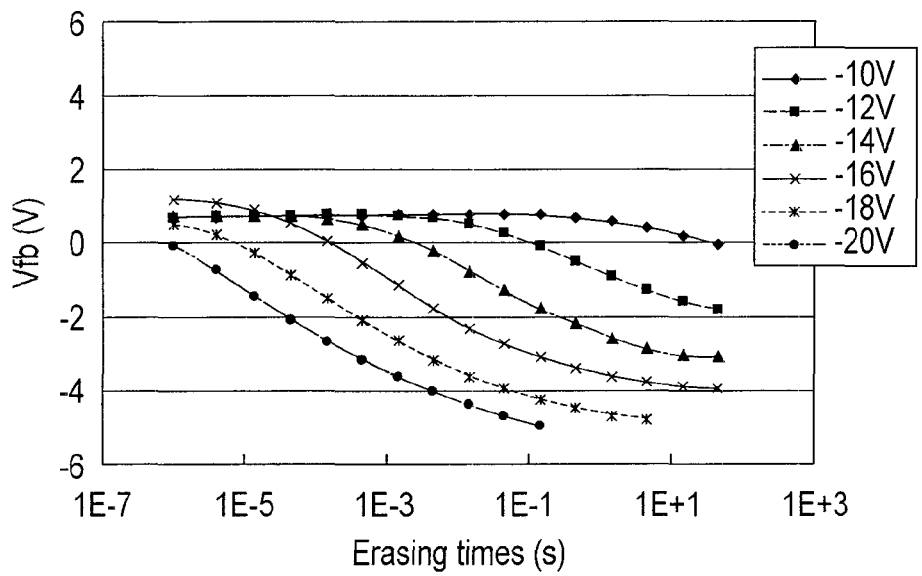
FIG. 8 is a diagram showing erasing characteristics of the semiconductor device according to the first embodiment.
Figure 9:
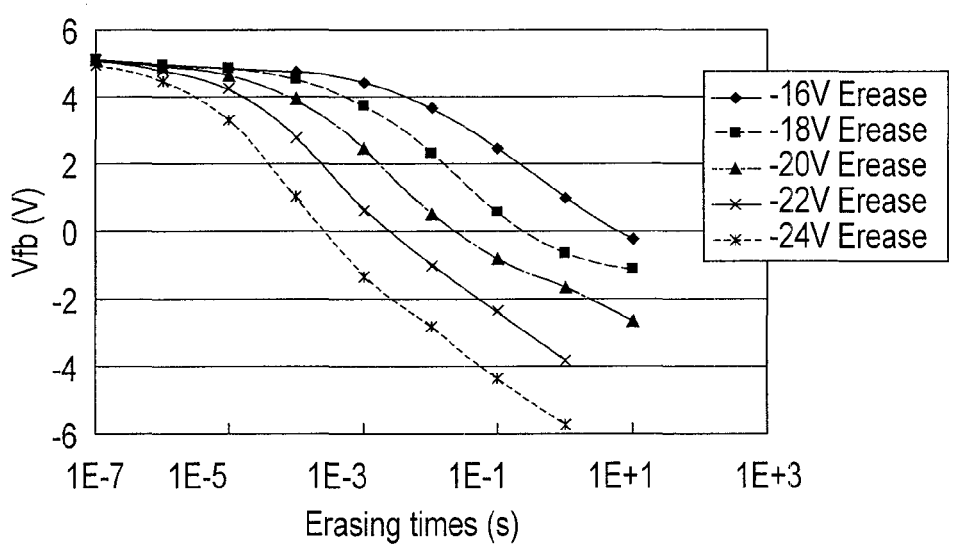
FIG. 9 is a diagram showing erasing characteristics of the semiconductor device according to the comparative example in contrast to the first embodiment.

Next, the erasing characteristics of the semiconductor device according to the present embodiment will be described with reference to FIGS. 8 and 9. FIG. 8 is a diagram showing the results of measuring CV characteristics of a sample manufactured by the method according to the present embodiment. FIG. 9 is a diagram showing the results of measuring CV characteristics of a sample according to a comparative example. The horizontal axis indicates erasing time, whereas the vertical axis indicates a flat band voltage (Vfb).

The sample according to the present embodiment uses a hafnium oxide film (thickness of 5 nm) for the charge storage insulating film, whereas the sample according to the comparative example uses a silicon nitride film (thickness of 5 nm) for the charge storage insulating film. For the block insulating film, each of the samples uses an aluminum oxide film (thickness of 10 nm).

The measurements of the CV characteristics were made in the following way. First, a writing voltage of 20 V is applied to the both samples for a period of 1 msec. Then, respective erasing voltages from −10 V to −20 V by 2 V are applied to the sample according to the present embodiment. In this regard, the erasing time is varied from 1 μsec to 30 sec. Respective erasing voltages are applied from −16 V to −24 V by 2 V to the sample according to the comparative example. The erasing time is varied from 0.1 μsec to 10 sec. Then, the characteristics (CV characteristics) of the electric capacitance are measured at each erasing voltage and for each erasing time.

The followings are determined from the measurement results for the sample according to the present embodiment (FIG. 8) and the measurement results for the sample according to the comparative example (FIG. 9). When a comparison is made at the same erasing voltage and the same Vfb, the erasing time is shorter in the case of the sample according to the present embodiment than in the case of the sample according to the comparative example. Therefore, the sample according to the present embodiment allows higher speed erasing to be carried out. It is to be noted that the sample according to the present embodiment apparently seems to provide a slow erasing operation in the region in which Vfb is approximately 0.8 V or more. This is because proper erasing characteristics failed to be measured due to constraints in the sample measurement, which are caused by such a difference in sample structure as being independent of the characteristics of the storage film itself, such as, for example, the difference in Vfb initialization level depending on the presence or absence of a diffusion layer. In the region in which Vfb is lower than approximately 0.8 V, while such a proper measurement that shows innate characteristics of the storage film is possible because of no constraints in the sample measurement, the erasing time is shorter in the case of the sample according to the present embodiment. Therefore, considering that the characteristics in the region in which Vfb is lower than 0.8 V are extrapolated into the region in which Vfb is 0.8 V or more, the erasing time is actually considered shorter in the case of the sample according to the present embodiment even in the region in which Vfb is 0.8 V or more. In addition, when a comparison is made in value at which the Vfb shift is saturated, the saturation value in the negative direction is larger in the case of the sample according to the present embodiment than in the case of the sample according to the comparative example. Therefore, the sample according to the present embodiment allows more effective charges to be erased.

Next, the charge retention characteristics of the semiconductor device according to the present embodiment will be described with reference to FIGS. 10 and 11. FIG. 10 is a diagram showing the results of measuring charge retention characteristics of a sample manufactured by the method according to the present embodiment. FIG. 11 is a diagram showing the results of measuring charge retention characteristics of a sample according to a comparative example. The horizontal axis indicates retention time, whereas the vertical axis indicates a flat band voltage (Vfb).

The sample according to the present embodiment uses a hafnium oxide film (thickness of 5 nm) for the charge storage insulating film, whereas the sample according to the comparative example uses a silicon nitride film (thickness of 5 nm) for the charge storage insulating film. For the block insulating film, each of the samples uses an aluminum oxide film (thickness of 10 nm).

The measurements of the charge retention characteristics were made in the following way. The sample according to the present embodiment is heated to 125° C., and an erasing voltage of −20 V is applied to the sample for a period of 1 msec. Then, a writing voltage is applied to shift the flat band voltage to 2.8 V. Then, the flat band voltage Vfb is measured from after a lapse of 20 sec to a lapse of 8000 sec. On the other hand, the sample according to the comparative example is heated to 85° C., and a writing voltage is applied to the sample to shift the flat band voltage in the range from 3.5 V to 6.5 V. Then, the flat band voltage Vfb is measured from after a lapse of 20 sec to a lapse of 8000 sec.

As can be seen from FIGS. 10 and 11, the flat band voltage Vfb is also hardly shifted in the case of the sample according to the present embodiment, as in the case of the sample according to the comparative example.

FIG. 12 is a diagram showing the rate of change of flat band voltage Vfb for the sample according to the present embodiment and the sample according to the comparative example, with (a) the measurement results for the sample according to the present embodiment and (b) the measurement results for the sample according to the comparative example, in which (c) shows the upper limit of specification value. It is determined that the sample according to the present embodiment also has favorable performance as in the case of the sample according to the comparative example.

As can be also seen from the respective measurement results described above, the semiconductor device according to the present embodiment provides high-speed writing/erasing characteristics, and allows the achievement of excellent charge retention characteristics. Therefore, the semiconductor device according to the present embodiment allows the achievement of a high-performance nonvolatile semiconductor memory which is excellent in characteristics and reliability.

FIG. 13 is a diagram showing the results of X-ray diffraction for charge storage insulating films using hafnium oxide films, with (a1) the measurement result for the sample according to the present embodiment and (a2) the theoretical calculation result for a hafnium oxide which has a cubic crystal structure, and with (b1) the measurement result for the sample according to the comparative example and (b2) the theoretical calculation result for a hafnium oxide which has a monoclinic crystal structure.

As shown in FIG. 13, a hafnium oxide film which has a cubic crystal structure is obtained in the case of the sample according to the present embodiment. On the other hand, a hafnium oxide film which has a monoclinic crystal structure is provided in the case of the sample according to the comparative example. In the case of the sample according to the present embodiment, the charge storage insulating film is formed from the hafnium oxide which has a cubic crystal structure, and thus, as can be seen from the measurement results already mentioned, the sample according to the present embodiment has excellent electrical characteristics. On the other hand, when the charge storage insulating film is formed from the hafnium oxide which has a monoclinic crystal structure, it is not possible to obtain excellent electrical characteristics.

FIG. 14 is a diagram showing a measurement result obtained by a GIXA (glancing incidence X-ray analysis) for the charge storage insulating film (hafnium oxide film) of the sample according to the present embodiment. When the GIXA profile is subjected to fitting assuming the density for each film, the film density of the hafnium oxide film is 10.7 g/cm$^3$, which is in excellent agreement with the theoretical film density (10.4 g/cm$^3$) of a hafnium oxide film which has a cubic crystal structure. Therefore, the hafnium oxide film according to the present embodiment is considered to have almost no defects therein such as a void of a crystal grain boundary.

FIG. 15 is a diagram showing a measurement result obtained by a GIXA for the charge storage insulating film (hafnium oxide film) of the sample according to the comparative example. The hafnium oxide film according to the comparative example has a film density of 8.9 g/cm$^3$, which corresponds to on the order of 89 percent of the theoretical film density (10.0 g/cm$^3$) of the hafnium oxide which has a monoclinic crystal structure. More specifically, while the hafnium oxide according to the comparative example, which has a monoclinic crystal structure, is supposed to have defects such as a void of a crystal grain boundary therein on the order of 11 percent, these defects are inactive for charge storage, and found not to improve the charge storage characteristics.

From the results in FIGS. 14 and 15 described above, it is considered that the oxygen vacancy present in the cubic crystal structure, rather than the defect such as a void of a crystal grain boundary, is important for the charge storage action of the charge storage insulating film using the hafnium oxide.

FIG. 16 is a diagram showing a measurement result of XPS (X-ray photoemission spectroscopy) for the hafnium oxide film according to the present embodiment, which has a cubic crystal structure. The binding energy has two peaks resulting from Hf—O bonding, which appears in a region of 16 to 19 eV. On the other hand, the binding energy has no clear-cut peak observed in a region of 12 to 15 eV. The current XPS analysis has a sensitivity limit on the order of 5 percent. Therefore, the hafnium oxide film according to the present embodiment, which has a cubic crystal structure, is considered to have an oxygen vacancy ratio less than 5 percent. More specifically, the ratio of the number of oxygen vacancies to the total number of atoms in the hafnium oxide film is considered less than 5 percent.

It is to be noted that the hafnium oxide film to serve as the charge storage insulating film may contain zirconium (Zr) in the embodiment described above. For example, the hafnium oxide film may contain zirconium therein on the order of 2 atomic percent or less. This is because Hf and Zr have particularly similar chemical properties, which requires some costs for separation from each other, and the raw material for Hf, which is required in the manufacturing method as described in the present embodiment and available at realistic cost, contains Zr on the order of 1 atomic percent. In the case of the samples for the confirmation of the characteristics in the present application, such a raw material for Hf is used. The device characteristic change resulting from the physical difference between Hf and Zr will not appear within the range of experimental accuracy, when the mixed amount of Zr is 2 atomic percent or less. As described above, even when the hafnium oxide film contains zirconium therein, it is possible to achieve an effect similar to that in the embodiment described above.

In addition, while the heat treatment for converting the hafnium oxide film 13a to the hafnium oxide film 13 which has a cubic crystal structure is carried out before forming the control gate electrode film 15 in the embodiment described above, the heat treatment may be carried out after forming the control gate electrode film 15.

It is to be noted that it is possible to achieve the hafnium oxide film which has a cubic crystal structure, even when the hafnium oxide film contains at least a certain amount or more of impurity elements (for example, a series of elements such as yttrium (Y) and lanthanum (La)) therein. However, the hafnium oxide film containing these impurity elements has a trap level in an inappropriate position, thus failing to obtain a semiconductor device which is excellent in both writing/erasing characteristics and charge retention characteristics. In addition, in the semiconductor device, the presence of impurity elements as described above is a major factor that causes deterioration of characteristics and reliability. Therefore, it is not preferable that the hafnium oxide film contains therein the impurity elements as described above. In the present embodiment, the hafnium oxide film which has a cubic crystal structure is formed due to an oxygen vacancy, and a semiconductor device which has excellent characteristics can be thus obtained without encountering the problem as described above.

In addition, as can be seen from the above description, the hafnium oxide film according to the present embodiment is preferably formed substantially of only hafnium, zirconium, and oxygen. Therefore, in the hafnium oxide film according to the present embodiment, the ratio of the total number of atoms of hafnium, zirconium, and oxygen to the total number of atoms in the hafnium oxide film is preferably higher than 99 atomic percent.

It is to be noted that while the example of using gold as the control electrode 15 has been described in the embodiment described above, TaC may be used in place of gold. The aspect other than the control electrode 15 is the same as in the embodiment described above. The use of a TaC electrode as the control electrode 15 has advantages such as the stability of the control electrode 15, which is achieved even in the case of using a high-temperature heat treatment in a step after the formation of the control electrode 15. The case of using a metal electrode including multiple constituent elements as the control electrode 15 as in the present modification example has advantages such as the capability to design the work function of the electrode by modulating the composition of the electrode.

In addition, it is also possible to use a highly doped polycrystalline silicon as the control electrode 15. The aspect other than the control electrode 15 is the same as in the embodiment described above. This case has advantages such as favorable compatibility with processes for conventional semiconductor integrated circuits using silicon.

In addition, it is also possible to use a highly doped amorphous silicon as the control electrode 15. The aspect other than the control electrode 15 is the same as in the embodiment described above. This case has advantages such as favorable compatibility with processes for conventional semiconductor integrated circuits using silicon. In particular, the case of amorphous also has advantages such as allowing the diffusion of the other elements in the vicinity of the control electrode to be suppressed.

In addition, it is also possible to use a semiconductor material such as a highly doped silicon germanium or indium phosphide as the control electrode 15. The aspect other than the control electrode 15 is the same as in the embodiment described above. When there is no need to apply a high heat treatment in the subsequent process, depending on the materials for the block insulating film, the selection of the materials allows problems such as interdiffusion to be suppressed.

In addition, while an aluminum oxide film is used as the block insulating film 14 in the embodiment described above, it is also possible to use a high dielectric constant film such as, for example, a LaHfO film, a LaTiO film, a PrSiO film, a LaAlO film, or a LaAlSiO film. The aspect other than the block insulating film 14 is the same as in the embodiment described above. The use of these high dielectric constant films can reduce the effective oxide thickness of the entire device, and thus allows for a contribution to miniaturization of the device to reduce the driving voltage of the device.

In addition, it is also possible to use a wide bandgap $SiO_2$ film, etc. as the block insulating film 14.

Furthermore, while a $SiO_2$ film is used as the tunnel insulating film 12 in the embodiment described above, a SiON film may be used. The aspect other than the tunnel insulating film 12 is the same as in the embodiment described above. The use of the SiON tunnel insulating film has advantages such as the capability to improve the reliability of the tunnel insulating film.

In addition, various types of insulating films such as $SiO_2$ based films, for example, a Ge-doped $SiO_2$ film may be used as the tunnel insulating film 12. The aspect other than the tunnel insulating film 12 is the same as in the embodiment described above. The use of various types of $SiO_2$ based tunnel insulating films has advantages such as the capability to improve the high voltage characteristics of the tunnel insulating film.

In addition, various types of insulating films such as an insulating film including a $SiO_2$ part, for example, a multi-layer film of $SiO_2$ and other material may be used as the tunnel insulating film 12. The aspect other than the tunnel insulating film 12 is the same as in the embodiment described above. The use of various types of tunnel insulating films such as a multi-layer film of $SiO_2$ and other material has advantages such as the capability to improve the high voltage characteristics of the tunnel film.

While the heat treatment is carried out at 1050° C. for 30 seconds in a nitrogen gas atmosphere in the embodiment described above, the heat treatment is not limited to this condition. It is not a problem if no heat treatment is carried out at all. In fact, when a sample subjected to only an inevitable heat treatment in the other step was also prepared to confirm its characteristics, the sample rather exhibited, in a way, excellent characteristics than those in the embodiment described above. The aspect other than the heat treatment is the same as in the embodiment described above.

While the example for the thickness of 5 nm has been described as that of the tunnel insulating film in the embodiment described above, the tunnel insulating film may have a thickness of 3 nm or more and 9 nm or less. The thickness of less than 3 nm will cause leakage of electric charges stored in the storage film from the tunnel insulating film. The thickness of more than 9 nm will fail to inject electric charges from the tunnel insulating film into the charge storage film. The aspect other than the film thickness of the tunnel insulating film is the same as in the embodiment described above.

While the example for the thickness of 10 nm has been described as that of the block film in the embodiment described above, the block insulating film may have a thickness of 5 nm or more and 20 nm or less. The thickness of less than 5 nm will cause leakage of electric charges stored in the storage film from the block insulating film. The thickness of more than 20 nm will fail to inject electric charges from the tunnel insulating film into the charge storage film, because most electric field is applied to the block insulating film during the charge storage operation. The aspect other than the film thickness of the block insulating film is the same as in the embodiment described above.

While the example for the thickness of 5 nm has been described as the film thickness of the charge storage film including the hafnium oxide in the embodiment described above, the charge storage film may have a thickness of 3 nm or more and 6 nm or less. The thickness of less than 3 nm will cause the hafnium oxide to fail to maintain the film structure in the case of going through the steps subsequent to the deposition of the charge storage film, thereby resulting in a rapid decline in stored charges. The thickness more than 6 nm will fail to inject electric charges from the tunnel insulating film into the charge storage film, because most electric field is applied to the charge storage film during the charge storage operation. The aspect other than the film thickness of the charge storage film is the same as in the embodiment described above.

It is to be noted that while the ratio of the total number of atoms of hafnium, zirconium, and oxygen is supposed to be higher than 99% in the embodiment described above, the ratio of the total number of atoms of hafnium, zirconium, and oxygen may be 99% or less as will be described later, when the contained element is silicon.

Embodiment 2

Figure 17:
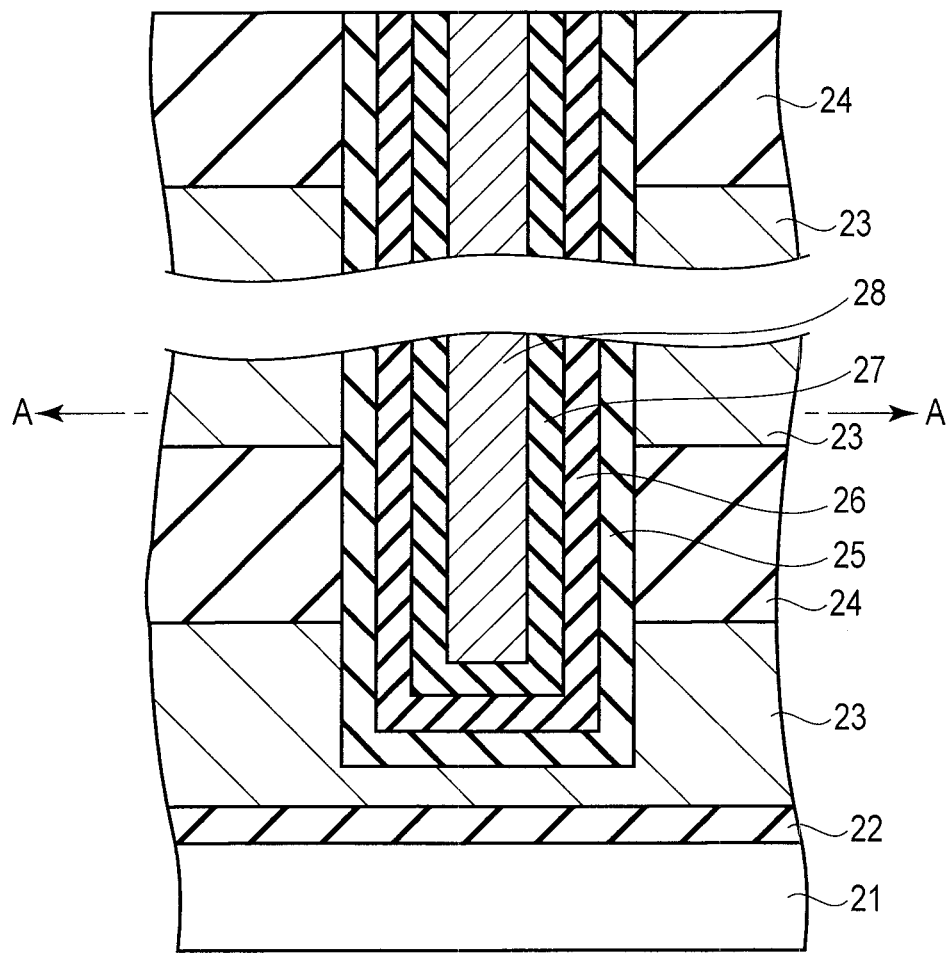
FIG. 17 is a cross-sectional view schematically illustrating the fundamental structure of a semiconductor device according to second to fifth embodiments.

FIG. 17 is a cross-sectional view schematically illustrating the fundamental structure of a semiconductor device (a charge trapping nonvolatile semiconductor storage device) according to a second embodiment. FIG. 18 is a cross-sectional view of FIG. 17 along the line A-A.

As shown in FIGS. 17 and 18, a substrate insulating film 22 is formed on a silicon substrate (semiconductor substrate) 21. On the substrate insulating film 22, a control gate electrode 23 and a control electrode insulating film 24 are stacked alternately. A block insulating film 25, a charge storage insulating film 26, a tunnel insulating film 27, and a columnar semiconductor region 28 to serve as a channel are formed inside the stack structure including the control gate electrodes 23 and the control electrode insulating films 24. In other words, the side surface of the semiconductor region 28 is surrounded by the stack structure including the control gate electrodes 23 and the control electrode insulating films 24, the block insulating film 25, the charge storage insulating film 26, and the tunnel insulating film 27. In another respect, the tunnel insulating film 27 is formed on the surface of the semiconductor region 28, the charge storage insulating film 26 is formed on the surface of the tunnel insulating film 27, the block insulating film 25 is formed on the surface of the charge storage insulating film 26, and the control gate electrodes 23 are formed on the surface of the block insulating film 25. As can be seen from FIGS. 17 and 18, the nonvolatile semiconductor storage device according to the present embodiment has a structure of a plurality of memory cells stacked in the vertical direction.

A single crystalline silicon (Si) substrate with a (100) plane exposed is used for the silicon substrate 21.

The substrate insulating film 22 is formed in such a way that the silicon substrate 21 is thermally oxidized by, for example, a thermal oxidation method. A CVD (chemical vapor deposition) method, a sputtering method, etc. can also be used for the formation of the substrate insulating film 22. In addition, it is possible to use various types of insulating materials such as SiN, $Al_2O_3$, and HfSiO in addition to $SiO_2$, for the material of the substrate insulating film 22.

For example, polycrystalline silicon formed by a CVD method can be used for the control gate electrode 23. Not only the CVD method but also a sputtering method can be used for the formation of the control gate electrode 23. In addition, the material of the control gate electrode 23 may be not only polycrystalline silicon, but also other materials as long as the materials are excellent in electrical conductivity. Preferably, the material of the control gate electrode 23 may be excellent in heat resistance. In addition, more preferably, the work function may be adjusted to an appropriate value, and it is also possible to use, for example, Ta or a Ta compound.

For example, a $SiO_2$ film formed by a CVD method can be used for the control electrode insulating film 24. Not only the CVD method but also various methods such as a sputtering method and an MBE method can be used for the formation of the control electrode insulating film 24. In addition, the material of the control electrode insulating film 24 is not limited to $SiO_2$, and it is possible to use various types of insulating films such as SiN, $Al_2O_3$, and HfSiO.

The number of stacked layers of control gate electrodes 23 and control electrode insulating films 24 is, for example, 32. However, the number of stacked layers is not particularly limited, and it is possible to adopt any number of stacked layers.

After stacking the control gate electrode films 23 and the control electrode insulating films 24, such a hole is formed that passes through all of the control gate electrode films 23 and control electrode insulating films 24 stacked.

The hole may be formed in more than once. For example, after stacking four control gate electrode films 23 and four control electrode insulating films 24, a lower portion of the hole is formed before further forming four control gate electrode films 23 and four control electrode insulating films 24. Subsequently, an upper portion of the hole may be formed. Having an excessively large number of stacked layers creates a problem of difficulty with etching conditions for the forming the upper portion and lower portion of the hole so as to have cross sections within an acceptable error range. Having an excessively small number of stacked layers creates a problem of such an additional time-consuming lithography that forms an upper portion of the hole so as to overlap with a previously formed lower portion of the hole. The hole may be formed in three times or more.

After the formation of the hole, the block insulating film 25 is formed from $SiO_2$ by, for example, a CVD method along the inner wall of the hole. While the method for forming the block insulating film is not limited to the CVD method, the method needs to be a deposition method which is excellent in step coverage. Therefore, a deposition method which is classified into a broadly defined CVD method is desirable. For example, while it is not impossible to use a sputtering method, there is the need to use a special approach such as deposition in a high gas pressure atmosphere around the transition region from a glow region to an arc region.

After the formation of the block insulating film 25, the charge storage insulating film 26 which contains silicon (Si) and includes a hafnium oxide including a cubic region is formed on the surface of the block insulating film 25. The charge storage insulating film 26 is formed by, for example, an ALD (Atomic Layer Deposition) method. It is to be noted that various types of deposition methods which fall into the category of CVD method can be used for the method for forming the charge storage insulating film 26. For example, the following method can be used.

It is possible to use various types of deposition methods such as hot-wall thermal CVD method, an APCVD method (Atmospheric pressure CVD), an LPCVD method (Low-pressure CVD), a UHVCVD method (Ultrahigh vacuum CVD), an AACVD method (Aerosol assisted CVD), a DLICVD method (Direct liquid injection CVD), a MPCVD method (Microwave plasma-assisted CVD), a PECVD method (Plasma-Enhanced CVD), a RPECVD method (Remote plasma-enhanced CVD), an ALCVD method (Atomic layer CVD), an HWCVD method (Hot wire CVD), a Cat-CVD method (catalytic CVD), an HFCVD method (hot filament CVD), a MOCVD method (Metalorganic chemical vapor deposition), an HPCVD method (Hybrid Physical-Chemical Vapor Deposition), a RTCVD method (Rapid thermal CVD), a VPE method (Vapor phase epitaxy), a thermal CVD method, a PECVD method (Plasma Enhanced CVD), an HDPCVD method (high density plasma chemical vapor deposition), an MCVD method (modified chemical vapor deposition), a DCVD method (digital chemical vapor deposition), a SACVD method (Sub-Atmospheric CVD), an ECD method (Electro Chemical Deposition), an ALD method (Atomic layer deposition).

It is possible to use the followings as the molecule including a Hf atom for the formation of the charge storage insulating film 26.

It is possible to use alkyl hafnium compounds such as tetramethyl hafnium, tetraethyl hafnium, tetrapropyl hafnium, tetraisopropyl hafnium, tetrabutyl hafnium, tetraisobutyl hafnium, tetra-sec-butyl hafnium, and tetra-ter-butyl hafnium; organic acid hafnium or organic acid hafnyl compounds such as hafnium formate, hafnium acetate, hafnium propionate, hafnium butyrate, hafnium isobutyrate, hafnium valerate, hafnium caproate, hafnium caprylate, hafnium 2-ethylhexanoate, hafnium caprate, hafnium neodecanoate, hafnium rosinate, hafnium naphthenate, hafnyl formate, hafnyl acetate, hafnyl propionate, hafnyl butyrate, hafnyl isobutyrate, hafnyl valerate, hafnyl caproate, hafnylcaprylate, hafnyl 2-ethylhexanoate, hafnyl caprate, hafnyl neodecanoate, hafnyl rosinate, and hafnium naphthenate; alkoxy hafnium compounds such as tetrakis(methoxy)hafnium, tetrakis(ethoxy)hafnium, tetrakis(propoxy)hafnium, tetrakis(isopropoxy)hafnium, tetrakis(butoxy)hafnium, tetrakis(isobutyloxy)hafnium, tetrakis(sec-butoxy)hafnium, tetrakis(terbutoxy)hafnium, tetrakis(amiloxy)hafnium, tetrakis(teramiloxy)hafnium, tetrakis[2-(2-methoxy)ethoxy]hafnium, tetrakis[2-(1-methyl-2-methoxy)propoxy]hafnium, tetrakis[2-(2-methoxy)propoxy]hafnium, tetrakis[2-(dimethylamino)ethoxy]hafnium, tetrakis[2-(2-dimethylamino-1-methyl)propoxy]hafnium, tetrakis[2-(2-dimethylamino)propoxy]hafnium, bis(2-propoxy)bis[2-(2-dimethylamino-1-methyl)propoxy]hafnium, bis(ter-butoxy)bis[2-(2-dimethylamino-1-methyl)propoxy]hafnium, bis(ter-butoxy)bis[2-(2-dimethylamino)propoxy]hafnium, (ter-butoxy)tris[2-(2-dimethylamino-1-methyl)propoxy]hafnium, tris(ter-butoxy)[2-(2-dimethylamino-1-methyl)propoxy]hafnium; amino hafnium compounds such as tetrakis(dimethylamino)hafnium, tetrakis(diethylamino)hafnium, tetrakis(ethylmethylamino)hafnium, tetrakis(dipropyl)hafnium, tetrakis(dibutylamino)hafnium, bis(dimethylamino)bis(diethylamino)hafnium, bis(diethylamino)bis(ethylmethylamino)hafnium, (diethylamino)tris(ethylmethylamino)hafnium; amino hafnium compounds such as bis(methoxy)bis(dimethylamino)hafnium, bis(methoxy)bis(diethylamino)hafnium, bis(methoxy)bis(ethylmethylamino)hafnium, bis(ethoxt)bis(dimethylamino)hafnium, bis(ethoxy)bis(diethylamino)hafnium, bis(ethoxy)bis(ethylmethylamino)hafnium, bis(2-propoxy)bis(diethylamino)hafnium, bis(ter-butyl)bis(diethylamino)hafnium, bis(ter-butyl)bis(ethylmethylamino)hafnium, (ter-butyl)tris(ethylmethyl)hafnium; alkyl-substituted β-diketonates such as tetrakisacetylacetonate, tetrakishexane-2,4-dionate, tetrakis-5-methylhexane-2,4-dionate, tetrakisheptane-2,4-dionate, tetrakis-2-methylheptane-3,5-dionate, tetrakis-5-methylheptane-2,4-dionate, tetrakis-6-methylheptane-2,4-dionate, tetrakis-2,2-dimethylheptane-3,5-dionate, tetrakis-2,6-dimethylheptane-3,5-dionate, tetrakis-2,2,6-trimethylheptane-3,5-dionate, tetrakis-2,2,6,6-tetramethylheptane-3,5-dionate, tetrakis-octane-2,4-dionate, tetrakis-2,2,6-trimethyloctane-3,5-dionate, tetrakis-2,6-dimethyloctane-3,5-dionate, tetrakis-2-methyl-6-ethyldecane-3,5-dionate, tetrakis-2,2-dimethyl-6-ethyldecane-3,5-dionate; fluorine-substituted alkyl β-diketonates such as tetrakis-1,1,1-trifluoropentane-2,4-dionate, tetrakis-1,1,1-trifluoro-5,5-dimethylhexane-2,4-dionate, tetrakis-1,1,1,5,5,5-hexafluoropentane-2,4-dionate, tetrakis-1,3-diperfluorohexylpropane-1,3-dionate; hafnium β-diketonate compounds such as ether-substituted β-diketonates such as tetrakis-1,1,5,5-tetramethyl-1-methoxyhexane-2,4-dionate, tetrakis-2,2,6,6-tetramethyl-1-methoxyheptane-3,5-dionate, tetrakis-2,2,6,6-tetramethyl-1-(2-methoxyethoxy)heptane-3,5-dionate; and cyclopentadienyl hafnium compounds such as tetrakiscyclopentadienyl hafnium, tetrakis(methylcyclopentadienyl)hafnium, tetrakis(ethylcyclopentadienyl)hafnium, tetrakis(pentamethylcyclopentadienyl)hafnium; alkyl hafnium compounds; organic acid hafnium compounds; alkoxy hafnium compounds; aminohafnium compounds; hafnium β-diketonate compounds; cyclopentadienyl compounds; hafnium halides such as hafnium tetrachloride; hafnyl chloride; hafnium β-diketonate compounds; and above all, in particular, hafnium chlorides, tetrakisdimethylaminohafnium (TDMAH), tetrakisethylmethylaminohafnium (TEMAH), etc. It is possible to use one or more of these molecules. It is easy to gasify the molecules constituting these materials, and it is thus possible to form a thin film containing hafnium by introducing gasified molecules in the vicinity of the substrate.

It is possible to use the followings as the molecule containing a Si atom for growing the charge storage insulating film 26.

It is possible to use monosilane, disilane, a phenyl group, diethoxymethylsilane, dimethyldimethoxysilane, dimethyldiethoxysilane, methyltrimethoxysilane, methyltriethoxysilane, hexamethyldisiloxane, octamethylcyclotetrasiloxane, 1,1,1,3,3,5,5,5-octamethyltrisiloxane, N,N,N',N',N",N"-hexamethylsilane triazine, tetraisocyanatesilane, dimethyldimethoxysilane, tetramethylsilane, trimethylsilane, dimethylsilane, methylsilane, 1,1,3,3-tetramethyl-1,3-disiloxane, trimethoxysilane, trimethylvinylsilane, 1,3,5,7-tetramethylcyclotetrasiloxane, 1,1,1,3,3,3-hexamethyldisilazane, and tetraethoxysilane, and above all, in particular, trisdimethylaminosilane (TDMAS), tetraethoxysilane (TEOS), 1,1,1,3,3,3-hexamethyldisilazane (HMDS), etc. It is possible to use one or more of these molecules. It is easy to gasify the molecules constituting these materials, and it is thus possible to form a thin film containing silicon by introducing gasified molecules in the vicinity of the substrate.

In the present embodiment, a mixed gas of the molecule containing Hf and the molecule containing Si is used in the case of forming the charge storage insulating film 26. Further, a molecule containing oxygen ($O_2$, $O_3$, $H_2O$, $H_2O_2$, NO, $NO_2$, $N_2O$, CO, $CO_2$, alcohols, etc.) is mixed. As a result, it is made possible to form such a charge storage insulating film that contains hafnium (Hf), silicon (Si), and oxygen (O).

As for the mixing ratio between Hf and Si in the charge storage insulating film 26, the ratio of Si to Si and Hf as cationic components is preferably 4% or more and 50% or less. The Si ratio of less than 4% or more than 50% makes it difficult to form cubic $HfO_2$. Preferably, the Si ratio is 12% or more and 15% or less. This is because when the Si ratio is less than 12% or more than 15%, the ratio of the cubic $HfO_2$ is deceased to cause the relative dielectric constant of $HfO_2$ to lower than the maximum value.

After the formation of or in the process of forming the charge storage insulating film 26, the charge storage insulating film 26 may be modified by a heat treatment or the like. As the method for modifying the charge storage film, it is possible to use various modification methods such as a method using plasma, a method of ion or particle collision, a method using a highly reactive gas such as ozone, a method using particles such as radicals in a higher internal energy state than the ground state, and a method of combining these methods, in addition to the heat treatment. A first object of the modification in this case is to remove an undesired compositional component contained in the charge storage insulating film 26, a second object thereof is to add a compositional component desired to be contained in the charge storage insulating film 26, a third object thereof is to vary the compositional distribution of the charge storage insulating film 26, and a fourth object thereof is to vary the crystalline state in the charge storage insulating film 26. Therefore, for example, a modification may be carried out in such a way that a hafnia film is formed, a film containing Si is then formed, and the Si is mixed into the hafnia by a heat treatment.

After the formation of the charge storage insulating film 26, the tunnel insulating film 27 is formed on the surface of the charge storage insulating film 26. For the material of the tunnel insulating film 27, $SiO_2$, SiON, etc. can be used. Various types of deposition methods which fall into the category of CVD can be used for the method for forming the tunnel insulating film 27.

After the formation of the tunnel insulating film 27, the semiconductor region (channel region) 28 is formed on the surface of the tunnel insulating film 27. While silicon such as polycrystalline silicon is preferably used for the material of the channel region, it is also possible to use amorphous or polycrystalline semiconductor materials such as IGZO (In-GaZnO), various types of semiconductor nanotubes, various types of semiconductor nanowires, etc. The channel region 28 is desirably formed so as to fill all of the holes.

In the subsequent process, a method described in, for example, Jpn. Pat. Appln. KOKAI Publication No. 2007-266143 is used to form a stack-type nonvolatile memory. In addition, prior to the process described in the present embodiment, it is possible to use the method such as one described in Jpn. Pat. Appln. KOKAI Publication No. 2007-266143.

From the nonvolatile memory manufactured in the way described above, an X-ray diffraction profile resulting from the cubic $HfO_2$ was obtained, and it has been thus confirmed that the charge storage insulating film 26 includes a large amount of cubic $HfO_2$.

On the other hand, when the method according to the present embodiment was not used, an X-ray diffraction profile resulting from the monoclinic $HfO_2$ was obtained, and it has been thus confirmed that the charge storage insulating film 26 includes a large amount of monoclinic $HfO_2$. This case has been confirmed to be inferior in charge storage characteristics, as compared with the case of using the method according to the present embodiment.

As described above, according to the present embodiment, the silicon contained can achieve a charge storage insulating film containing a hafnium oxide including a cubic region. As a result, high-speed writing/erasing characteristics are obtained, while it is possible to achieve excellent charge retention characteristics, and it is thus possible to achieve a high-performance nonvolatile semiconductor memory which is excellent in characteristics and reliability.

In addition, a method which is excellent in step coverage and belongs to CVD can be used as the method for forming the charge storage insulating film, and a three-dimensional nonvolatile semiconductor device which has memory cells stacked in the vertical direction as described above can be thus effectively formed.

Embodiment 3

The fundamental structure of a semiconductor device according to the present embodiment is the same as in the second embodiment described above. Therefore, the present embodiment will also refer to FIGS. 17 and 18 as in the case of the second embodiment.

The structures up to the block insulating film 25 are formed in the same way as in the second embodiment. Then, the charge storage insulating film 26 is formed on the surface of the block insulating film 25. A method for forming the charge storage insulating film 26 according to the present embodiment will be described below.

First, a film containing silicon (Si) and oxygen (O) is formed on the surface of the block insulating film 25. This film is formed by, for example, an ALD method. It is to be noted that various types of deposition methods which fall into the category of CVD method can be used for the method for forming this film. Specifically, the various types of deposition methods (hot-wall thermal CVD method, an APCVD method, a LPCVD method, . . . , etc.) which fall into the category of CVD method mentioned in the second embodiment can be used.

As the molecule containing a Si atom for growing the film containing Si and O, the various types of molecules containing a Si atom (monosilane, disilane, a phenyl group, . . . , etc.) mentioned in the second embodiment can be used. It is possible to use one or more of these molecules. It is easy to gasify the molecules constituting these materials, and it is thus possible to form a thin film containing silicon by introducing gasified molecules in the vicinity of the substrate. For the molecule containing oxygen, the molecules mentioned in the second embodiment can be used.

Just after forming the film containing Si and O, the film may contain therein elements derived from the molecule containing a Si atom, such as carbon. It is also possible to adopt such an approach that removes impurities such as carbon by applying a post-treatment such as a heat treatment or a plasma treatment to the film containing the elements derived from the molecule containing a Si atom.

After the formation of the film containing Si and O, a film containing hafnium (Hf) and oxygen (O) is formed by, for example, an ALD method. It is to be noted that various types of deposition methods which fall into the category of CVD method can be used for the method for forming this film. Specifically, the various types of deposition methods (hot-wall thermal CVD method, an APCVD method, a LPCVD method, . . . , etc.) which fall into the category of CVD method mentioned in the second embodiment can be used.

As the molecule containing a Hf atom for forming the film containing Hf and O, the various types of molecules containing a Hf atom (tetramethyl hafnium, tetraethyl hafnium, tetrapropyl hafnium, . . . , etc.) mentioned in the second embodiment can be used. It is possible to use one or more of these molecules. It is easy to gasify the molecules constituting these materials, and it is thus possible to form a thin film containing hafnium by introducing gasified molecules in the vicinity of the substrate. For the molecule containing oxygen, the molecules mentioned in the second embodiment can be used.

After the formation of the film containing Hf and O, a heat treatment is carried out at a temperature of 800° C. or more and 1300° C. or less. This heat treatment mixes the film containing Si and O partially or entirely with the film containing Hf and O. Alternatively, short-time anneal out of thermal equilibrium on the order of milliseconds to nanoseconds may be carried out, such as flashlamp anneal or laser anneal. The mixing treatment includes not only the heat treatment but also cases of mixing by bombarding deposited particles and the like during deposition. In addition, it is also possible to carry out the mixing treatment more than once at any stage after depositing each of the film containing Si and O and the film containing Hf and O one or more times.

The charge storage insulating film 26 after the heat treatment has, in the film thickness direction, such a gradient composition as a higher concentration of Si and a lower concentration of Hf closer to the block insulating film 25, and a lower concentration of Si and a higher concentration of Hf further away from the block insulating film 25.

The gradient composition preferably has no region left in which the concentration of Si or $SiO_2$ is 100% or the concentration of Hf or $HfO_2$ is 0%. If such a region is left, the storage capability as the storage film will be deteriorated.

In the gradient composition, the Si concentration preferably has a maximum value of 50% or less with respect to Hf and Si. This is because the Si concentration of more than 50% with respect to Hf and Si makes it difficult to create a cubic crystal structure of $HfO_2$.

In the gradient composition, the Si concentration preferably has a minimum value of 4% or more with respect to Hf and Si. This is because the Si concentration of less than 4% with respect to Hf and Si makes it difficult to create a cubic crystal structure of $HfO_2$.

The heat treatment for mixing the film containing Si and O and the film containing Hf and O may also serve as a heat treatment for removing impurities such as carbon contained in the film containing Si and O and the film containing Hf and O.

It is also possible to carry out the heat treatment for mixing the film containing Si and O and the film containing Hf and O at an appropriate stage in the subsequent process, such as after forming the film containing Si and O and the film containing Hf and O or after forming the tunnel film.

The subsequent process (such as the step of forming the charge storage insulating film 26 or the tunnel insulating film 27) is the same as in the second embodiment, and descriptions thereof will be thus omitted.

FIG. 19 shows an X-ray diffraction profile for the charge storage insulating film 26 manufactured as described above. Both a peak resulting from a monoclinic crystal of the hafnium oxide and a peak resulting from a cubic crystal of the hafnium oxide are observed to provide favorable storage characteristics.

The charge storage insulating film obtained in the present embodiment has a smaller amount of cubic $HfO_2$ component, as compared with the charge storage film manufactured in the way as in the second embodiment. However, the charged center position can be shifted toward the block insulating film side, because the block insulating film side has a larger amount of Si. Therefore, the leakage current to the tunnel insulating film side can be reduced to improve the retention characteristics. Furthermore, there is an advantage that the region rich in cubic $HfO_2$ and the region rich in monoclinic $HfO_2$ can be controlled in the film thickness direction to place the region rich in cubic $HfO_2$ in a position in which the charged center is to be guided.

Next, modification examples of the present embodiment will be described. While the film containing Si and O is formed in the embodiment described above, a film containing Si but no O is formed instead of the film containing Si and O in the present modification example. The other is the same as in the embodiment described above.

The use of this method allows, for the charge storage insulating film 26 which has a compositional gradient, the formation of a charge storage insulating film in which the ratio of oxygen to Hf and Si is lower than the stoichiometry.

The oxygen ratio smaller than the stoichiometry allows the ratio of $HfO_2$ which has a cubic crystal structure to be increased in the charge storage insulating film 26, and thus allows the writing characteristics and erasing characteristics of the charge storage insulating film 26 to be improved.

Embodiment 4

The fundamental structure of a semiconductor device according to the present embodiment is the same as in the second embodiment described above. Therefore, the present embodiment will also refer to FIGS. 17 and 18 as in the case of the second embodiment.

The structures up to the block insulating film 25 are formed in the same way as in the second embodiment. Then, the charge storage insulating film 26 is formed on the surface of the block insulating film 25. A method for forming the charge storage insulating film 26 according to the present embodiment will be described below.

First, a film containing hafnium (Hf) and oxygen (O) is formed on the surface of the block insulating film 25. This film is formed by, for example, an ALD method. It is to be noted that various types of deposition methods which fall into the category of CVD method can be used for the method for forming this film. Specifically, the various types of deposition methods (hot-wall thermal CVD method, an APCVD method, a LPCVD method, . . . , etc.) which fall into the category of CVD method mentioned in the second embodiment can be used.

As the molecule containing a Hf atom for forming the film containing Hf and O, the various types of molecules containing a Hf atom (tetramethyl hafnium, tetraethyl hafnium, tetrapropyl hafnium, . . . , etc.) mentioned in the second embodiment can be used. It is possible to use one or more of these molecules. It is easy to gasify the molecules constituting these materials, and it is thus possible to form a thin film containing hafnium by introducing gasified molecules in the vicinity of the substrate. For the molecule containing oxygen, the molecules mentioned in the second embodiment can be used.

Just after forming the film containing Hf and O, the film may contain therein elements derived from the molecule containing a Hf atom, such as carbon. It is also possible to adopt such an approach that removes impurities such as carbon by applying a post-treatment such as a heat treatment or a plasma treatment to the film containing the elements derived from the molecule containing a Hf atom.

The ratio of oxygen to Hf is preferably lower than the stoichiometry. However, after going through the step of removing impurities such as carbon by carrying out a post-treatment such as a heat treatment, a plasma treatment, an oxidation treatment, or a reduction treatment, such a process in which oxygen is in agreement with the stoichiometry is typically excellent in controllability. Therefore, the ratio of oxygen to Hf may be in agreement with the stoichiometry.

After the formation of the film containing Hf and O, a film containing silicon (Si) and oxygen (O) is formed by, for example, an ALD method. It is to be noted that various types of deposition methods which fall into the category of CVD method can be used for the method for forming this film. Specifically, the various types of deposition methods (hot-wall thermal CVD method, an APCVD method, a LPCVD method, . . . , etc.) which fall into the category of CVD method mentioned in the second embodiment can be used.

As the molecule containing a Si atom for growing the film containing Si and O, the various types of molecules containing a Si atom (monosilane, disilane, a phenyl group, . . . , etc.) mentioned in the second embodiment can be used. It is possible to use one or more of these molecules. It is easy to gasify the molecules constituting these materials, and it is thus possible to form a thin film containing silicon by introducing gasified molecules in the vicinity of the substrate. For the molecule containing oxygen, the molecules mentioned in the second embodiment can be used.

Just after forming the film containing Si and O, the film may contain therein elements derived from the molecule containing a Si atom, such as carbon. It is also possible to adopt such an approach that removes impurities such as carbon by applying a post-treatment such as a heat treatment or a plasma treatment to the film containing the elements derived from the molecule containing a Si atom.

After the formation of the film containing Si and O, a heat treatment is carried out at a temperature of 800° C. or more and 1300° C. or less. This heat treatment mixes the film containing Hf and O partially or entirely with the film containing Si and O. Alternatively, short-time anneal out of thermal equilibrium on the order of milliseconds to nanoseconds may be carried out, such as flashlamp anneal or laser anneal. The mixing treatment includes not only the heat treatment but also cases of mixing by bombarding deposited particles and the like during deposition. In addition, it is also possible to carry out the mixing treatment more than once at any stage after depositing each of the film containing Hf and O and the film containing Si and O one or more times.

The charge storage insulating film 26 after the heat treatment has, in the film thickness direction, such a gradient composition as a higher concentration of Hf and a lower concentration of Si closer to the block insulating film 25, and a lower concentration of Hf and a higher concentration of Si further away from the block insulating film 25.

The gradient composition preferably has no region left in which the concentration of Si or $SiO_2$ is 100% or the concentration of Hf or $HfO_2$ is 0%. If such a region is left, the storage capability as the storage film will be deteriorated.

In the gradient composition, the Si concentration preferably has a maximum value of 50% or less with respect to Hf and Si. This is because the Si concentration of more than 50% with respect to Hf and Si makes it difficult to create a cubic crystal structure of $HfO_2$.

In the gradient composition, the Si concentration preferably has a minimum value of 4% or more with respect to Hf and Si. This is because the Si concentration of less than 4% with respect to Hf and Si makes it difficult to create a cubic crystal structure of $HfO_2$.

The heat treatment for mixing the film containing Si and O and the film containing Hf and O may also serve as a heat treatment for removing impurities such as carbon contained in the film containing Si and O and the film containing Hf and O.

It is also possible to carry out the heat treatment for mixing the film containing Si and O and the film containing Hf and O at an appropriate stage in the subsequent process, such as after forming the film containing Si and O and the film containing Hf and O or after forming the tunnel film.

The subsequent process (such as the step of forming the charge storage insulating film 26 or the tunnel insulating film 27) is the same as in the second embodiment, and descriptions thereof will be thus omitted.

While the charge storage insulating film manufactured in this way has a smaller amount of cubic $HfO_2$ component, as compared with the charge storage film manufactured by the method according to the second embodiment, the charge storage insulating film has the advantage that deterioration of the tunnel insulating film can be suppressed, because the tunnel insulating film side has a larger amount of Si. Furthermore, there is an advantage that the region rich in cubic $HfO_2$ and the region rich in monoclinic $HfO_2$ can be controlled in the film thickness direction to place the region rich in cubic $HfO_2$ in a position in which the charged center is to be guided.

It is to be noted that while the film containing Si and O is formed in the embodiment described above, a film containing Si but no O may be formed instead of the film containing Si and O.

Embodiment 5

The fundamental structure of a semiconductor device according to the present embodiment is the same as in the second embodiment described above. Therefore, the present embodiment will also refer to FIGS. 17 and 18 as in the case of the second embodiment.

The structures up to the block insulating film 25 are formed in the same way as in the second embodiment. Then, the charge storage insulating film 26 is formed on the surface of the block insulating film 25. A method for forming the charge storage insulating film 26 according to the present embodiment will be described below.

First, a film containing silicon (Si) and oxygen (O) is formed on the surface of the block insulating film 25. This film is formed by, for example, an ALD method. It is to be noted that various types of deposition methods which fall into the category of CVD method can be used for the method for forming this film. Specifically, the various types of deposition methods (hot-wall thermal CVD method, an APCVD method, a LPCVD method, . . . , etc.) which fall into the category of CVD method mentioned in the second embodiment can be used.

As the molecule containing a Si atom for growing the film containing Si and O, the various types of molecules containing a Si atom (monosilane, disilane, a phenyl group, . . . , etc.) mentioned in the second embodiment can be used. It is possible to use one or more of these molecules. It is easy to gasify the molecules constituting these materials, and it is thus possible to form a thin film containing silicon by introducing gasified molecules in the vicinity of the substrate. For the molecule containing oxygen, the molecules mentioned in the second embodiment can be used.

Just after forming the film containing Si and O, the film may contain therein elements derived from the molecule containing a Si atom, such as carbon. It is also possible to adopt such an approach that removes impurities such as carbon by applying a post-treatment such as a heat treatment or a plasma treatment to the film containing the elements derived from the molecule containing a Si atom.

After the formation of the film containing Si and O, a film containing hafnium (Hf) and oxygen (O) is formed by, for example, an ALD method. It is to be noted that various types of deposition methods which fall into the category of CVD method can be used for the method for forming this film. Specifically, the various types of deposition methods (hot-wall thermal CVD method, an APCVD method, a LPCVD method, . . . , etc.) which fall into the category of CVD method mentioned in the second embodiment can be used.

As the molecule containing a Hf atom for forming the film containing Hf and O, the various types of molecules containing a Hf atom (tetramethyl hafnium, tetraethyl hafnium, tetrapropyl hafnium, . . . , etc.) mentioned in the second embodiment can be used. It is possible to use one or more of these molecules. It is easy to gasify the molecules constituting these materials, and it is thus possible to form a thin film containing hafnium by introducing gasified molecules in the vicinity of the substrate. For the molecule containing oxygen, the molecules mentioned in the second embodiment can be used.

Just after forming the film containing Hf and O, the film may contain therein elements derived from the molecule containing a Hf atom, such as carbon. It is also possible to adopt such an approach that removes impurities such as carbon by applying a post-treatment such as a heat treatment or a plasma treatment to the film containing the elements derived from the molecule containing a Hf atom.

The ratio of oxygen to Hf is preferably lower than the stoichiometry. However, after going through the step of removing impurities such as carbon by carrying out a post-treatment such as a heat treatment, a plasma treatment, an oxidation treatment, or a reduction treatment, such a process in which oxygen is in agreement with the stoichiometry is typically excellent in controllability. Therefore, the ratio of oxygen to Hf may be in agreement with the stoichiometry.

After the formation of the film containing Hf and O, a film containing silicon (Si) and oxygen (O) is formed by, for example, an ALD method. It is to be noted that various types of deposition methods which fall into the category of CVD method can be used for the method for forming this film. Specifically, the various types of deposition methods (hot-wall thermal CVD method, an APCVD method, a LPCVD method, ..., etc.) which fall into the category of CVD method mentioned in the second embodiment can be used.

As the molecule containing a Si atom for growing the film containing Si and O, the various types of molecules containing a Si atom (monosilane, disilane, a phenyl group, ..., etc.) mentioned in the second embodiment can be used. It is possible to use one or more of these molecules. It is easy to gasify the molecules constituting these materials, and it is thus possible to form a thin film containing silicon by introducing gasified molecules in the vicinity of the substrate. For the molecule containing oxygen, the molecules mentioned in the second embodiment can be used.

Just after forming the film containing Si and O, the film may contain therein elements derived from the molecule containing a Si atom, such as carbon. It is also possible to adopt such an approach that removes impurities such as carbon by applying a post-treatment such as a heat treatment or a plasma treatment to the film containing the elements derived from the molecule containing a Si atom.

After the formation of the film containing Si and O, a heat treatment is carried out at a temperature of 800° C. or more and 1300° C. or less. This heat treatment mixes the film containing Hf and O partially or entirely with the film containing Si and O. Alternatively, short-time anneal out of thermal equilibrium on the order of milliseconds to nanoseconds may be carried out, such as flashlamp anneal or laser anneal. The mixing treatment includes not only the heat treatment but also cases of mixing by bombarding deposited particles and the like during deposition. In addition, it is also possible to carry out the mixing treatment more than once at any stage after depositing each of the film containing Hf and O and the film containing Si and O one or more times.

The charge storage insulating film 26 after the heat treatment has, in the film thickness direction, such a gradient composition as a higher concentration of Si and a lower concentration of Hf closer to both the block insulating film 25 and the tunnel insulating film 27, and a higher concentration of Hf and a lower concentration of Si in a central region in the film thickness direction.

The gradient composition preferably has no region left in which the concentration of Si or $SiO_2$ is 100% or the concentration of Hf or $HfO_2$ is 0%. If such a region is left, the storage capability as the storage film will be deteriorated.

In the gradient composition, the Si concentration preferably has a maximum value of 50% or less with respect to Hf and Si. This is because the Si concentration of more than 50% with respect to Hf and Si makes it difficult to create a cubic crystal structure of $HfO_2$.

In the gradient composition, the Si concentration preferably has a minimum value of 4% or more with respect to Hf and Si. This is because the Si concentration of less than 4% with respect to Hf and Si makes it difficult to create a cubic crystal structure of $HfO_2$.

The heat treatment for mixing the film containing Si and O and the film containing Hf and O may also serve as a heat treatment for removing impurities such as carbon contained in the film containing Si and O and the film containing Hf and O.

It is also possible to carry out the heat treatment for mixing the film containing Si and O and the film containing Hf and O at an appropriate stage in the subsequent process, such as after forming the film containing Si and O and the film containing Hf and O or after forming the tunnel film.

The subsequent process (such as the step of forming the charge storage insulating film 26 or the tunnel insulating film 27) is the same as in the second embodiment, and descriptions thereof will be thus omitted.

While the charge storage insulating film manufactured in this way has a smaller amount of cubic $HfO_2$ component, as compared with the charge storage film manufactured by the method according to the second embodiment, the charge storage insulating film has the advantage that the retention characteristics can be improved by shifting the charged center position because the block insulating film side has a larger amount of Si, and the advantage that deterioration of the tunnel insulating film can be suppressed because the tunnel insulating film side has a larger amount of Si.

It is to be noted that while the film containing Si and O is formed in the embodiment described above, a film containing Si but no O may be formed instead of the film containing Si and O.

The following modifications can be made to the second to fifth embodiments described above.

In the deposition of the charge storage insulating film 26, the film containing Si and O and the film containing Hf and O may be each deposited two or more times, and then subjected to a mixing treatment through a heat treatment or the like. The mixing treatment includes not only the heat treatment but also cases of mixing by bombarding deposited particles and the like during deposition. In addition, it is also possible to carry out the mixing treatment more than once at any stage after depositing each of the film containing Si and O and the film containing Hf and O one or more times.

The charge storage insulating film manufactured in this way may have the problem of taking a lot of trouble with the deposition, thereby leading to an increase in the cost, as compared with the charge storage films manufactured in the way as in the first embodiment, etc., but on the other hand, the former insulating film has advantages such as an ability to adopt optimum deposition conditions for each component, rather than the deposition condition at a middle point between an optimum condition for deposition of the Hf component and an optimum condition for deposition of the Si component.

Alternatively, in the deposition of the charge storage insulating film 26, the film containing Si and O and the film containing Hf, Si and O and containing Hf as its main constituent may be each deposited one or more times, and then subjected to a mixing treatment through a heat treatment or the like. The mixing treatment includes not only the heat treatment but also cases of mixing by bombarding deposited particles and the like during deposition. In addition, in order to deposit the charge storage insulating film 26, it is also possible to carry out the mixing treatment more than once at any stage after depositing each of the film containing Si and O and the film containing Hf, Si and O and containing Hf as its main constituent one or more times.

The charge storage insulating film manufactured in this way may have the problem of taking a lot of trouble with the deposition, thereby leading to an increase in the cost, as compared with the charge storage films manufactured in the way as in the first embodiment, etc., but on the other hand, the former film has advantages such as an achievable method of adjusting the Si concentration in the film containing Hf as its main constituent as a condition of mixing the Hf component and the Si component.

Alternatively, in the deposition of the charge storage insulating film 26, the film containing Si, Hf, and O and containing Si as its main constituent and the film containing Hf and O may be each deposited one or more times, and then subjected to a mixing treatment through a heat treatment or the like. The mixing treatment includes not only the heat treatment but also cases of mixing by bombarding deposited particles and the like during deposition. In addition, in order to deposit the charge storage insulating film 26, it is also possible to carry out the mixing treatment more than once at any stage after depositing each of the film containing Si, Hf, and O and containing Si as its main constituent and the film containing Hf and O one or more times.

The charge storage insulating film manufactured in this way may have the problem of taking a lot of trouble with the deposition, thereby leading to an increase in the cost, as compared with the charge storage films manufactured in the way as in the first embodiment, etc., but on the other hand, the former film has advantages such as an achievable method of adjusting the Hf concentration in the film containing Si as its main constituent as a condition of mixing the Hf component and the Si component.

In addition, in the deposition of the charge storage insulating film 26, while the oxygen composition is either in agreement with or not higher than the stoichiometry in the second to fifth embodiments, the oxygen composition may exceed the stoichiometry. For example, various approaches are possible, such as an oxidation method using plasma, an oxygen injection method through an ion implantation method, an approach of using an oxygen atom or atom group which is chemically more active than $O_2$ molecules, and an approach of preparing a block insulating film to be in a peroxidative status in advance, and subsequently oxidizing the charge storage insulating film by a heat treatment.

This case with such an excessive oxygen also provides a cubic crystal structure, and thus has advantages such as improved charge storage characteristics.

In addition, the hafnium oxide included in the charge storage insulating film 26 may include a monoclinic region to some extent in addition to the cubic region.

In addition, it is also possible to use, as the substrate 21, various types of semiconductor substrates such as a substrate including polycrystalline silicon, a SiGe substrate, and an InP substrate. A semiconductor is preferably used for the substrate, because there is a need to form a peripheral integrated circuit for driving the nonvolatile semiconductor storage device. However, the placement of an external circuit is also possible, rather than the formation of a peripheral integrated circuit on the substrate. In addition, it is also possible to form a peripheral circuit in a semiconductor section formed separately from the substrate, rather than the formation of a peripheral integrated circuit on the substrate.

In addition, in the formation of the hole in the multilayer film, the hole may be formed so as not to reach the substrate insulating film 22 as shown in FIG. 17, or the hole may be formed so as to reach the substrate insulating film 22 as shown in FIG. 20. In addition, as shown in FIG. 21, the hole may be formed so as to pass through the substrate insulating film 22 and reach the substrate 21.

Embodiment 6

Figure 22:
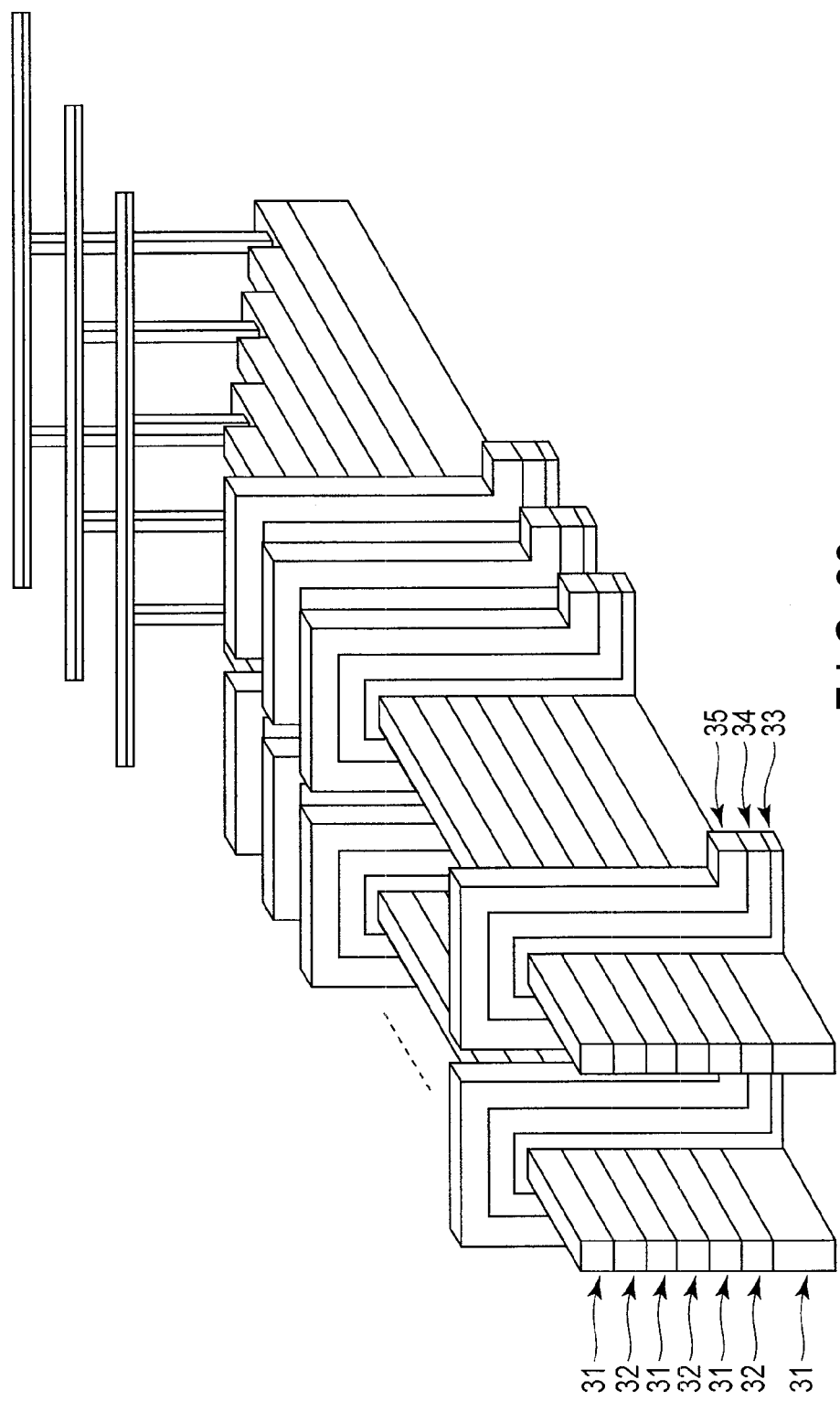
FIG. 22 is a cross-sectional view schematically illustrating the fundamental structure of a semiconductor device according to a sixth embodiment.

FIG. 22 is a cross-sectional view schematically illustrating the fundamental structure of a semiconductor device (a charge trapping nonvolatile semiconductor storage device) according to a sixth embodiment.

On a semiconductor substrate, an insulating film 31 and a semiconductor channel layer 32 are each formed more than once. For example, an insulating film is formed by a method such as thermal oxidation on the semiconductor substrate, and a polycrystalline or amorphous Si layer is then formed. Then, an insulating film such as $SiO_2$ is formed by a method such as CVD. Furthermore, the process of forming the polycrystalline or amorphous Si layer and the process of forming the insulating film such as $SiO_2$ by a method such as CVD method are repeated more than once. Then, the stack structure including the insulating films 31 and the semiconductor channel layers 32 is subjected to etching to form a strip-shaped stack structure including the insulating films 31 and the semiconductor channel layers 32 on the substrate. Then, a tunnel insulating film 33 is formed on the side surface of the strip-shaped stack structure. Further, a charge storage insulating film 34 is formed, and a block insulating film 35 is formed. It is possible to use the same films as in the second to fifth embodiments for the charge storage insulating film 34. This structure allows the formation of a nonvolatile semiconductor memory including the deposition of a plurality of nonvolatile semiconductor storage elements stacked on a substrate and including the same high-performance charge storage insulating film as in the second to fifth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor region;
   a tunnel insulating film provided on the semiconductor region;
   a charge storage insulating film provided on the tunnel insulating film and having a hafnium oxide including a cubic region;
   a block insulating film provided on the charge storage insulating film; and
   a control gate electrode provided on the block insulating film,
   wherein a ratio of the total number of atoms of hafnium and oxygen in the charge storage insulating film is higher than 99 atomic percent.

2. The device according to claim 1, wherein the charge storage insulating film has an oxygen vacancy.

3. The device according to claim 1, wherein the charge storage insulating film contains zirconium.

4. The device according to claim 3, wherein a ratio of the total number of atoms of hafnium, zirconium, and oxygen in the charge storage insulating film is higher than 99 atomic percent.

5. The device according to claim 1, wherein the block insulating film is formed of an oxide film.

6. The device according to claim 1, wherein the semiconductor region is a semiconductor substrate, and the tunnel insulating film, the charge storage insulating film, the block insulating film, and the control gate electrode are stacked on the semiconductor substrate.

7. The device according to claim 1, wherein the semiconductor region is columnar, and the tunnel insulating film, the charge storage insulating film, the block insulating film, and the control gate electrode surround a side surface of the semiconductor region.

8. The device according to claim 1, wherein the hafnium oxide includes a monoclinic region.

9. A semiconductor device comprising:
a semiconductor region;
a tunnel insulating film provided on the semiconductor region;
a charge storage insulating film provided on the tunnel insulating film and having a hafnium oxide including a cubic region;
a block insulating film provided on the charge storage insulating film; and
a control gate electrode provided on the block insulating film,
wherein the hafnium oxide contains silicon.

10. The device according to claim 9, wherein the semiconductor region is columnar, and the tunnel insulating film, the charge storage insulating film, the block insulating film, and the control gate electrode surround a side surface of the semiconductor region.

11. The device according to claim 9, wherein the hafnium oxide includes a monoclinic region.

12. The device according to claim 9, wherein the charge storage insulating film contains zirconium.

13. The device according to claim 9, wherein the block insulating film is formed of an oxide film.

14. The device according to claim 9, wherein the semiconductor region is a semiconductor substrate, and the tunnel insulating film, the charge storage insulating film, the block insulating film, and the control gate electrode are stacked on the semiconductor substrate.

15. A method for manufacturing a semiconductor device comprising:
a semiconductor region;
a tunnel insulating film provided on the semiconductor region;
a charge storage insulating film provided on the tunnel insulating film;
a block insulating film provided on the charge storage insulating film; and
a control gate electrode provided on the block insulating film,
wherein forming the charge storage insulating film comprises forming a hafnium oxide including a cubic region, and
wherein forming the charge storage insulating film further comprises:
forming a preliminary hafnium oxide film formed of an amorphous film and used for the charge storage insulating film, and
converting the preliminary hafnium oxide film to a hafnium oxide film including a cubic region by a thermal treatment after forming the block insulating film, and
wherein a ratio of the total number of atoms of hafnium and oxygen in the charge storage insulating film is higher than 99 atomic percent.

16. A method for manufacturing a semiconductor device comprising:
a semiconductor region;
a tunnel insulating film provided on the semiconductor region;
a charge storage insulating film provided on the tunnel insulating film;
a block insulating film provided on the charge storage insulating film; and
a control gate electrode provided on the block insulating film,
wherein forming the charge storage insulating film comprises forming a hafnium oxide including a cubic region, and
wherein forming the charge storage insulating film further comprises:
forming a stacked film of a first film containing silicon and oxygen and a second film containing hafnium and oxygen, and
converting the stacked film to a hafnium oxide film including a cubic region by a thermal treatment, wherein the hafnium oxide film contains silicon.

17. The method according to claim 16, wherein the charge storage insulating film is formed by CVD.

* * * * *